(12) United States Patent
Kim

(10) Patent No.: US 11,425,840 B2
(45) Date of Patent: Aug. 23, 2022

(54) HEAT SINK WITH PROTRUSIONS ON MULTIPLE SIDES THEREOF AND APPARATUS USING THE SAME

(71) Applicant: Gerald Ho Kim, Riverside, CA (US)

(72) Inventor: Gerald Ho Kim, Riverside, CA (US)

( * ) Notice: Subject to any disclaimer, the term of this patent is extended or adjusted under 35 U.S.C. 154(b) by 0 days.

(21) Appl. No.: 17/092,301

(22) Filed: Nov. 8, 2020

(65) Prior Publication Data

US 2021/0059069 A1 Feb. 25, 2021

Related U.S. Application Data

(60) Continuation of application No. 16/691,394, filed on Nov. 21, 2019, now Pat. No. 10,834,849, which is a
(Continued)

(51) Int. Cl.
| | |
|---|---|
| *H05K 7/20* | (2006.01) |
| *H05K 1/02* | (2006.01) |
| *H01L 23/367* | (2006.01) |
| *H01L 23/427* | (2006.01) |
| *H01L 23/467* | (2006.01) |

(Continued)

(52) U.S. Cl.
CPC ........... *H05K 7/2029* (2013.01); *F28F 3/048* (2013.01); *H01L 23/367* (2013.01); *H01L 23/3675* (2013.01); *H01L 23/3677* (2013.01); *H01L 23/427* (2013.01); *H01L 23/4275* (2013.01); *H01L 23/467* (2013.01); *H01L 29/0657* (2013.01); *H05K 1/0204* (2013.01); *H05K 1/0206* (2013.01); *H05K 1/0209* (2013.01); *H05K 5/03* (2013.01); *H05K 5/04* (2013.01); *H01L 23/13* (2013.01); *H01L 2924/0002* (2013.01); *H05K 2201/066* (2013.01); *H05K 2201/09054* (2013.01)

(58) Field of Classification Search
CPC . H01L 23/467; H01L 23/3672; H01L 23/473; H01L 23/367; H01L 23/3677; H01L 23/3675; H01L 23/4275; H01L 29/0657; H01L 2924/0002; H01L 23/13; H01L 2924/00; H05K 1/0203; H05K 3/0061; H05K 1/0209; H05K 1/0204; H05K 2201/09054; H05K 2201/066; H05K 1/0206

See application file for complete search history.

(56) References Cited

U.S. PATENT DOCUMENTS

| | | | |
|---|---|---|---|
| 7,385,821 B1 * | 6/2008 | Feierbach | H01L 23/4332 165/104.33 |
| 7,907,411 B2 * | 3/2011 | Whittum | H05K 7/20372 361/710 |

(Continued)

*Primary Examiner* — Adam B Dravininkas
(74) *Attorney, Agent, or Firm* — Han IP PLLC; Andy M. Han

(57) ABSTRACT

A thermal management unit includes a heat sink, which includes a base portion having a first side and a second side opposite the first side. The heat sink also includes a first protrusion structure and a second protrusion structure. The first protrusion structure protrudes from the first side of the base portion, and the first protrusion structure includes a plurality of fins. The second protrusion structure protrudes from the second side of the base portion, and the second protrusion structure includes a plurality of ribs.

14 Claims, 13 Drawing Sheets

Related U.S. Application Data division of application No. 16/106,925, filed on Aug. 21, 2018, now abandoned, which is a continuation of application No. 15/459,637, filed on Mar. 15, 2017, now Pat. No. 10,076,059, which is a continuation of application No. 14/507,806, filed on Oct. 6, 2014, now abandoned.

(60) Provisional application No. 61/950,075, filed on Mar. 8, 2014.

(51) Int. Cl.
*H05K 5/03* (2006.01)
*H05K 5/04* (2006.01)
*H01L 23/13* (2006.01)
*H01L 29/06* (2006.01)
*F28F 3/04* (2006.01)

(56) References Cited

U.S. PATENT DOCUMENTS

| | | | | |
|---|---|---|---|---|
| 2003/0116312 A1* | 6/2003 | Krassowski | .......... | H01L 23/373 |
| | | | | 165/185 |
| 2004/0188064 A1* | 9/2004 | Upadhya | ................ | F04B 17/00 |
| | | | | 257/E23.098 |
| 2007/0171615 A1* | 7/2007 | Xia | ..................... | H01L 23/4275 |
| | | | | 361/700 |
| 2008/0115914 A1* | 5/2008 | Yang | ..................... | H01L 23/467 |
| | | | | 165/104.33 |
| 2009/0032217 A1* | 2/2009 | Wayman | ............... | H01L 23/367 |
| | | | | 165/80.3 |
| 2009/0154105 A1* | 6/2009 | Chu | .................... | F28D 15/0233 |
| | | | | 361/703 |
| 2010/0065249 A1* | 3/2010 | Liu | ..................... | F28D 15/0266 |
| | | | | 165/80.3 |
| 2010/0097767 A1* | 4/2010 | Jude | .................. | H05K 7/20454 |
| | | | | 361/709 |
| 2013/0175021 A1* | 7/2013 | Takigawa | ................. | F28F 3/02 |
| | | | | 165/185 |
| 2015/0289416 A1* | 10/2015 | Kim | ........................ | F28F 21/00 |
| | | | | 361/709 |

\* cited by examiner

HEAT SINK WITH PROTRUSIONS ON MULTIPLE SIDES THEREOF AND APPARATUS USING THE SAME

CROSS REFERENCE TO RELATED PATENT APPLICATION

The present disclosure is part of a Continuation of U.S. patent application Ser. No. 16/691,394, filed on 21 Nov. 2019 and issued as U.S. Pat. No. 10,834,849 on 10 Nov. 2020, which is a Divisional of U.S. patent application Ser. No. 16/106,925, filed on 21 Aug. 2018, which is a Continuation of U.S. patent application Ser. No. 15/459,637, filed on 15 Mar. 2017 and issued as U.S. Pat. No. 10,076,059 on 11 Sep. 2018, which is a Continuation of U.S. patent application Ser. No. 14/507,806, filed on 6 Oct. 2014, which claims the priority benefit of provisional application U.S. Patent Application No. 61/950,075, filed on 8 Mar. 2014. All the aforementioned applications are incorporated by reference in their entirety.

TECHNICAL FIELD

The present disclosure generally relates to the field of transfer of thermal energy and, more particularly, to thermal management in an electronic apparatus.

BACKGROUND

Unless otherwise indicated herein, the approaches described in this section are not prior art to the claims in this application and are not admitted to be prior art by inclusion in this section.

Compact heat-generating devices, such as integrated-circuits (including microprocessors, graphics chips, memory chips, radio frequency (RF) chips, networking communication chips, microwave chips, navigation chips, etc.), laser diodes, light-emitting diodes (LEDs), vertical-cavity surface emitting lasers (VCSELs) and the like, generate thermal energy, or heat, when in operation. Compact heat-generating devices may function as, for example, sensors or application-specific IC (ASIC) drivers in a telecom router, cellular phone tower, data communications server or mainframe computers. Regardless of which type of heat-generating device the case may be, heat generated by a compact heat-generating device needs to be removed or dissipated from the compact heat-generating device in order to achieve optimum performance of the compact heat-generating device by keeping its temperature within a safe operating range. With the form factor of compact heat-generating devices and the applications they are implemented in becoming ever smaller (e.g., the processor in a smartphone, a tablet computer or a notebook computer) and thus resulting in high heat density, it is imperative to effectively dissipate the high-density heat generated in an area of a small footprint to ensure safe and optimum operation of compact heat-generating devices operating under such conditions.

As compact heat-generating devices such as microprocessors, graphics chips, memory chips, etc. are typically mounted on a printed circuit board (PCB) inside an electronic apparatus (e.g., a portable device), the PCB itself often acts as a heat sink and/or heat spreader since at least part of the heat generated by a heat-generating device mounted on a PCB can be transferred from the heat-generating device to the PCB, e.g., by conduction through the direct contact(s) between the heat-generating device and the PCB. However, when there are more than on heat-generating devices mounted on the same PCB, have the PCB acting as a heat sink and/or heat spreader is not ideal as heat absorbed by the PCB from one heat-generating device tends to lower the thermal gradient in the PCB, thus lowering the amount of heat transferred to the PCB from another heat-generating device that is also mounted on the PCB. Worse, it may be possible that heat transferred from one heat-generating device is transferred to another heat-generating device through the PCB. In other words, when multiple heat-generating devices are mounted on the same PCB, thermal coupling between/among two or more of the multiple heat-generating devices through the PCB may occur, thus negatively impacting heat transfer away from one or more of the heat-generating devices to result in degradation in the performance and shortening of lifetime of the affected heat-generating devices.

SUMMARY

Various embodiments of a heat sink for thermal management in an electronic apparatus are provided. Embodiments of the heat sink of the present disclosure have fins on more than one side of the heat sink.

In one aspect, a thermal management unit may include a heat sink that includes a base portion, a first protrusion structure and a second protrusion structure. The base portion may have a first side and a second side opposite the first side. The first protrusion structure may protrude from the first side of the base portion, and may include a plurality of fins. The second protrusion structure may protrude from the second side of the base portion, and may include a plurality of ribs.

In some embodiments, the fins may extend along a first direction on the first side of the base portion, and the ribs may extend along the first direction on the second side of the base portion.

In some embodiments, the fins may extend along a first direction on the first side of the base portion, and the ribs may extend along a second direction on the second side of the base portion, where the first direction and second direction are orthogonal to one another.

In some embodiments, each of the fins may respectively include a base connected to the base portion and a tip opposite the base thereof. A surface facing an adjacent fin and connecting the tip and the base of a fin of the plurality of fins may be approximately 90° with respect to a plane defined by the first side of the base portion.

In some embodiments, each of the fins may respectively include a base connected to the base portion and a tip opposite the base thereof. A surface facing an adjacent fin and connecting the tip and the base of a fin of the plurality of fins may be greater than 90° with respect to a plane defined by the first side of the base portion.

In some embodiments, each of the ribs may respectively include a base connected to the base portion and a tip opposite the base thereof. A surface facing an adjacent rib and connecting the tip and the base of a rib of the plurality of ribs may be approximately 90° with respect to a plane defined by the second side of the base portion.

In some embodiments, each of the ribs may respectively include a base connected to the base portion and a tip opposite the base thereof. A surface facing an adjacent rib and connecting the tip and the base of a rib of the plurality of ribs may be greater than 90° with respect to a plane defined by the second side of the base portion.

In some embodiments, an amount of protrusion of a fin of the plurality of fins measured from the first side of the base portion and an amount of protrusion of a rib of the plurality of ribs measured from the second side of the base portion may be different.

In some embodiments, an amount of protrusion of a first rib of the plurality of ribs measured from the second side of the base portion and an amount of protrusion of a second rib of the plurality of ribs measured from the second side of the base portion may be different.

In some embodiments, the heat sink may be made of silicon.

In some embodiments, the thermal management unit may further include a phase-change material and a container. The phase-change material may be in direct contact with at least a portion of the heat sink. The container may be coupled to the heat sink such that the phase-change material is contained in a space defined by the container and the heat sink.

In some embodiments, the phase-change material may include a salt hydrate, an ionic liquid, paraffin, fatty acid, ester, an organic-organic compound, an organic-inorganic compound, or an inorganic-inorganic compound.

In some embodiments, the container may be made of silicon, plastic, ceramic or metal.

In some embodiments, the container may include a pouch that is coupled to the heat sink by heat and pressure, solder, pressure-sensitive adhesive, or epoxy.

In some embodiments, the container may include a pouch that includes a metallic foil.

In some embodiments, the container may include a pouch that includes an aluminum foil having surface areas coated with biaxially-oriented polyethylene terephthalate (BoPET).

In some embodiments, the container may be coupled to the first side of the heat sink such that the fins of the heat sink are in direct contact with the phase-change material.

In some embodiments, the container may be coupled to the second side of the heat sink such that the ribs of the heat sink are in direct contact with the phase-change material.

In some embodiments, the thermal management unit may further include a heat-generating device coupled to the first side of the heat sink. A side of the heat-generating device that faces the heat sink may be configured to interlockingly engage with the first protrusion structure of the heat sink.

In some embodiments, the thermal management unit may further include a thermal paste, solder, or epoxy disposed between the heat-generating device and the heat sink.

In another aspect, an electronic apparatus may include a main unit and a thermal management unit. The main unit may include a substrate and at least one integrated-circuit (IC) chip. The substrate may have a first side and a second side opposite the first side. The at least one IC chip may be disposed on the second side of the substrate. The thermal management unit may be disposed on the first side of the substrate. The thermal management unit may include a heat sink that includes a base portion, a first protrusion structure and a second protrusion structure. The base portion may have a first side and a second side opposite the first side. The first protrusion structure may protrude from the first side of the base portion, and may include a plurality of fins. The second protrusion structure may protrude from the second side of the base portion, and may include a plurality of ribs, the second protrusion structure in direct contact with the first side of the substrate when the heat sink is disposed on the first side of the substrate such that at least a portion of heat in the substrate is conducted to the heat sink through the second protrusion structure.

In some embodiments, the fins may extend along a first direction on the first side of the base portion, and the ribs may extend along the first direction on the second side of the base portion.

In some embodiments, the fins may extend along a first direction on the first side of the base portion, and the ribs may extend along a second direction on the second side of the base portion, where the first direction and second direction are orthogonal to one another.

In some embodiments, each of the fins may respectively include a base connected to the base portion and a tip opposite the base thereof. A surface facing an adjacent fin and connecting the tip and the base of a fin of the plurality of fins may be approximately 90° with respect to a plane defined by the first side of the base portion.

In some embodiments, each of the fins may respectively include a base connected to the base portion and a tip opposite the base thereof. A surface facing an adjacent fin and connecting the tip and the base of a fin of the plurality of fins may be greater than 90° with respect to a plane defined by the first side of the base portion.

In some embodiments, each of the ribs may respectively include a base connected to the base portion and a tip opposite the base thereof. A surface facing an adjacent rib and connecting the tip and the base of a rib of the plurality of ribs may be approximately 90° with respect to a plane defined by the second side of the base portion.

In some embodiments, each of the ribs may respectively include a base connected to the base portion and a tip opposite the base thereof. A surface facing an adjacent rib and connecting the tip and the base of a rib of the plurality of ribs may be greater than 90° with respect to a plane defined by the second side of the base portion.

In some embodiments, an amount of protrusion of a fin of the plurality of fins measured from the first side of the base portion and an amount of protrusion of a rib of the plurality of ribs measured from the second side of the base portion may be different.

In some embodiments, an amount of protrusion of a first rib of the plurality of ribs measured from the second side of the base portion and an amount of protrusion of a second rib of the plurality of ribs measured from the second side of the base portion may be different.

In some embodiments, the heat sink may be made of silicon.

In some embodiments, the electronic apparatus may further include a thermal epoxy disposed between the heat sink and the substrate.

In some embodiments, the electronic apparatus may further include a solder disposed between the ribs of the heat sink and the first side of the substrate. The electronic apparatus may additionally include a thermal epoxy or solder disposed in a space defined by the first side of the substrate and a gap between every two immediately adjacent ribs of the heat sink.

In some embodiments, the first side of the substrate may be at least partially metalized with a first metal layer, and at least one of the ribs having a surface that faces the substrate may be metalized with a second metal layer.

In some embodiments, the electronic apparatus may further include a solder disposed between the first side of the substrate and a surface of each of the ribs that faces the substrate such that the first metal layer and the second metal layer are bonded by the solder. The electronic apparatus may additionally include a thermal epoxy or solder disposed in a space defined by the first side of the substrate and a gap between every two immediately adjacent ribs of the heat sink.

In some embodiments, the first side of the substrate may include a pattern configured to interlockingly engage with the second protrusion structure of the heat sink when the heat sink is disposed on the first side of the substrate.

In some embodiments, the pattern may include a plurality of grooves corresponding to the ribs of the heat sink. The grooves may be configured to receive and be in direct contact with the ribs when the heat sink is disposed on the first side of the substrate.

In some embodiments, the substrate may include a multi-layered printed circuit board (PCB) that includes a plurality of PCB layers and one or more metal layers each of which sandwiched between two immediately adjacent PCB layers of the plurality of PCB layers.

In some embodiments, one or more of the PCB layers may be patterned to interlockingly engage with the second protrusion structure of the heat sink.

In some embodiments, a surface of each of the one or more of the PCB layers that are patterned to interlockingly engage with the second protrusion structure of the heat sink may define the first side of the substrate and may be metalized with a respective metal layer.

In some embodiments, the substrate may further include one or more thermal vias traversing a thickness of the substrate from the first side of the substrate to the second side of the substrate.

In some embodiments, at least one of the one or more thermal vias may correspond to a respective one of the at least one IC chip and may be configured to conduct heat from the respective one of the at least one IC chip in a direction from the second side of the substrate toward the first side of the substrate.

In some embodiments, the thermal management unit may further include a phase-change material and a container. The phase-change material may be in direct contact with at least a portion of the heat sink. The container may be coupled to the heat sink such that the phase-change material is contained in a space defined by the container and the heat sink.

In some embodiments, the phase-change material may include a salt hydrate, an ionic liquid, paraffin, fatty acid, ester, an organic-organic compound, an organic-inorganic compound, or an inorganic-inorganic compound.

In some embodiments, the container may be made of silicon, plastic, ceramic or metal.

In some embodiments, the container may include a silicon cover having a hollow therein.

In some embodiments, the container may include a pouch that is coupled to the heat sink by heat and pressure, solder, pressure-sensitive adhesive, or epoxy.

In some embodiments, the container may include a pouch that includes a metallic foil.

In some embodiments, the container may include a pouch that includes an aluminum foil having surface areas coated with BoPET.

In some embodiments, the container may be coupled to the first side of the heat sink such that the fins of the heat sink are in direct contact with the phase-change material.

In some embodiments, the container may be coupled to the second side of the heat sink such that the ribs of the heat sink are in direct contact with the phase-change material.

In some embodiments, the electronic apparatus may further include an enclosure enclosing the main unit and the thermal management unit therein. An inner side of the enclosure that faces the thermal management unit may be configured to interlockingly engage with the first protrusion structure of the heat sink.

In some embodiments, the enclosure may be made of metal.

In some embodiments, the electronic apparatus may further include a thermal paste, solder, or epoxy disposed between the enclosure and the heat sink.

The foregoing summary is illustrative only and is not intended to be limiting in any way. That is, the foregoing summary is provided to introduce concepts relating to a heat sink for thermal management in an electronic apparatus. Select embodiments of the novel and non-obvious technique are further described below in the detailed description. Thus, the foregoing summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

The present disclosure describes implementations of a heat sink for thermal management in an electronic apparatus. The heat sink in accordance with the present disclosure may be made of silicon or metal. In one implementation, the heat sink may have protrusions, e.g., fins and ribs, protruding from two opposing sides of a base portion of the heat sink. This novel and non-obvious design is different from conventional heat sinks in that conventional heat sinks are designed to be mounted on a flat surface while the heat sink of the present disclosure is mounted on a PCB, or any other heat spreader, with grooves that correspond to, receive and accommodate the protrusions on the bottom side of the heat sink. Protrusions on the bottom side of the heat sink increase the surface area for heat conduction between the PCB and the heat sink to enhance transfer heat from the PCB or any other heat spreader. Additionally, compared to heat sinks with a flat bottom side with no protrusions thereon, protrusions on the bottom side of the heat sink contribute to improvement on thermal stress relief.

In a multiple-layer, or multi-layered, PCB, most of the layers in the PCB spread heat around in order to remove heat. When mounted on a multi-layered PCB, protrusions on the bottom side of the heat sink of the present disclosure can remove heat from any of the multiple layers of the PCB such that the heat sink enables isolation of thermal effect between/among the layers of the multi-layered PCB. In other words, the proposed thermal management scheme of the present disclosure can isolate heat around layers of the PCB to allow compact heat-generating devices (e.g., ICs) mounted on the multi-layered PCB to operate at a lower temperature, thus enhancing the performance of the heat-generating devices.

In some implementations, a heat sink in accordance with the present disclosure has protrusions protruding from two opposing sides thereof in that protrusions (e.g., fins) on one side of the heat sink run in a first direction and protrusions (e.g., ribs) on the opposing side of the heat sink run in a second direction that is orthogonal, or perpendicular, to the first direction. This design increases stress tolerance for tensile or compressive forces within the structure of the heat sink, and thus making it feasible to manufacture large-size heat sinks with protrusions on two opposing sides thereof.

Illustrative Implementations

Figure 1A:
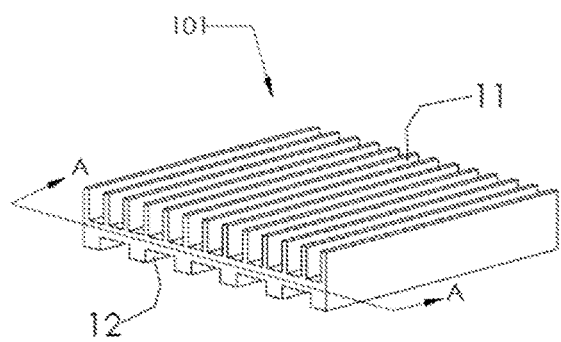
FIG. 1A is a perspective view of a heat sink in accordance with some embodiments of the present disclosure.
Figure 1B:
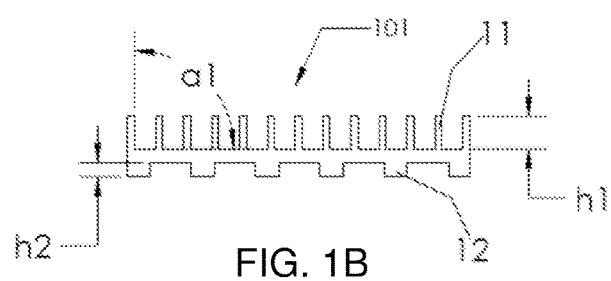
FIG. 1B is a cross-sectional view of the heat sink of FIG. 1A.

FIG. 1A is a perspective view of a heat sink 101 in accordance with some embodiments of the present disclosure. FIG. 1B is a cross-sectional view of heat sink 101 along the line AA'.

Heat sink 101 may be implemented in a thermal management unit which will be described below. As shown in FIGS. 1A and 1B, heat sink 101 includes a base portion, a first protrusion structure and a second protrusion structure. The base portion may have a first side (e.g., the top side as shown in FIGS. 1A and 1B) and a second side (e.g., the bottom side as shown in FIGS. 1A and 1B) that is opposite the first side. The first protrusion structure protrudes from the first side of the base portion, and includes multiple fins 11. The second protrusion structure protrudes from the second side of the base portion, and includes multiple ribs 12. In some other embodiments, the first protrusion structure may include multiple ribs and the second protrusion structure may include multiple fins. Alternatively, the first protrusion structure may include multiple fins and the second protrusion structure may include multiple fins. Still alternatively, the first protrusion structure may include multiple ribs and the second protrusion structure may include multiple ribs. Thus, those skilled in the art would appreciate that, although the first protrusion structure includes fins 11 and the second protrusion structure includes ribs 12 as illustrated in FIG. 1, the scope of the present disclosure is not limited thereto.

Heat sink 101 may additionally include protrusions from any of the secondary sides, or edges, between the first side and the second side of the base portion. That is, heat sink 101 may include protrusions that protrude from the base portion of heat sink 101 in two or more different directions. For simplicity, heat sink 101 is illustrated to have protrusions on the first side and the second side of the base portion thereof. Thus, those skilled in the art would appreciate that, although heat sink 101 has first protrusion structure and second protrusion structure protruding from the first side and the second side thereof as illustrated in FIG. 1, the scope of the present disclosure is not limited thereto and may include additional protrusion structures protruding in different direction(s).

In the example shown in FIGS. 1A and 1B, fins 11 extend along a first direction on the first side of the base portion, and ribs 12 extend along the first direction on the second side of the base portion. That is, fins 11 and ribs 12 extend along the same direction and thus are parallel to each other.

Each of the fins 11 respectively has a base connected to the base portion of the heat sink 101. Each of the fins 11 also respectively has a tip opposite the base thereof. In heat sink 101, a surface connecting the tip and the base of a first fin that faces a second fin which is immediately adjacent the first fin is approximately 90° with respect to a plane defined by the first side of the base portion. As shown in FIG. 1B, the angle α1 is approximately 90°. This feature is applicable to each of the fins 11 in heat sink 101. That is, each of the fins 11 of heat sink 101 has one or two main surfaces facing its immediately adjacent fin, and the one or more main surfaces are substantially parallel to each other and are substantially perpendicular to the plane defined by the first side of the base portion. In other words, a width of the base and a width of the tip of each of the fins 11 viewed in the direction as shown in FIG. 1B are substantially equal. Put differently, each of the fins 11 has a generally rectangular profile in the cross-sectional view as shown in FIG. 1B.

Similarly, each of the ribs 12 respectively has a base connected to the base portion of the heat sink 101. Each of the ribs 12 also respectively has a tip opposite the base thereof. In heat sink 101, a surface connecting the tip and the base of a first rib that faces a second rib which is immediately adjacent the first rib is approximately 90° with respect to a plane defined by the second side of the base portion. This feature is applicable to each of the ribs 12 in heat sink 101. That is, each of the ribs 12 of heat sink 101 has one or two main surfaces facing its immediately adjacent rib, and the one or more main surfaces are substantially parallel to each other and are substantially perpendicular to the plane defined by the second side of the base portion. In other words, a width of the base and a width of the tip of each of the ribs 12 viewed in the direction as shown in FIG. 1B are substantially equal. Put differently, each of the ribs 12 has a generally rectangular profile in the cross-sectional view as shown in FIG. 1B.

In some embodiments, an amount of protrusion of a fin of the fins 11 measured from the first side of the base portion (e.g., height h1 as shown in FIG. 1B) and an amount of protrusion of a rib of the ribs 12 measured from the second side of the base portion (e.g., height h2 as shown in FIG. 1B) are different. As shown in FIGS. 1A and 1B, the height of fins 11 is greater than the height of ribs 12.

In some embodiments, an amount of protrusion of a first rib of the ribs 12 measured from the second side of the base portion and an amount of protrusion of a second rib of ribs 12 measured from the second side of the base portion may be different. That is, ribs 12 may have the same height or different heights.

In some embodiments, heat sink 101 is made of silicon such as, for example, single-crystal silicon. Alternatively, heat sink 101 is made of metal such as, for example, copper, aluminum or an alloy.

In the case that heat sink 101 is made of silicon, a silicon wafer may be fabricated by etching or plasma-etching to create the first protrusion structure and the second protrusion structure on opposing sides of the silicon wafer. The size and pitches of fins 11 and ribs 12 may be different. Ribs 12 are configured to attach to a heat source or heat spreader such as, for example, a PCB, metal heat-plate, heat-generating device, etc. so that heat is transferred from the heat source or heat spreader to heat sink 101 through ribs 12. Fins 11 are configured to dissipate the heat into the surrounding (e.g., air). Accordingly, fins 11 have a height h1 greater than a height h2 of ribs 12 to result in a total surface area of fins 11 to be much larger than a total surface area of ribs 12. This is because fins 11 need to dissipate heat into the surrounding. The area ratio (h1/h2) of the height of fins 11 to the height of ribs 12 is thus at least greater than 1 in order to allow heat sink 101 to dissipate heat through fins 11. Otherwise, the heat may be accumulated in ribs 12.

Figure 2A:
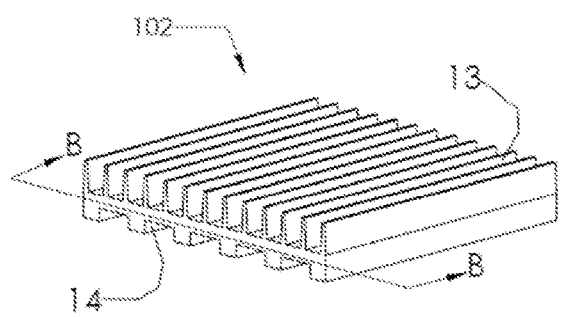
FIG. 2A is a perspective view of a heat sink in accordance with some embodiments of the present disclosure.
Figure 2B:
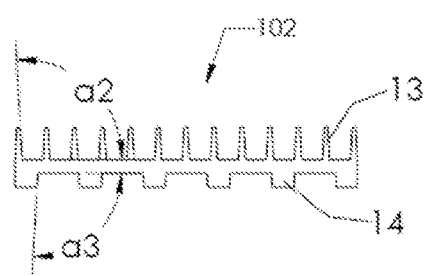
FIG. 2B is a cross-sectional view of the heat sink of FIG. 2A.

FIG. 2A is a perspective view of a heat sink 102 in accordance with some embodiments of the present disclosure. FIG. 2B is a cross-sectional view of heat sink 102 along the line BB'.

Heat sink 102 may be implemented in a thermal management unit which will be described below. As shown in FIGS. 2A and 2B, heat sink 102 includes a base portion, a first protrusion structure and a second protrusion structure. The base portion may have a first side (e.g., the top side as shown in FIGS. 2A and 2B) and a second side (e.g., the bottom side as shown in FIGS. 2A and 2B) that is opposite the first side. The first protrusion structure protrudes from the first side of the base portion, and includes multiple fins 13. The second protrusion structure protrudes from the second side of the base portion, and includes multiple ribs 14. One main difference between heat sink 102 and heat sink 101 is that the fins 13 and ribs 14 of heat sink 102 have a tapered, or sloped, structure as described below. That is, fins 13 and ribs 14 of heat sink 102 have tapered/sloped side walls. In some other embodiments, the first protrusion structure may include multiple ribs and the second protrusion structure may include multiple fins. Alternatively, the first protrusion structure may include multiple fins and the second protrusion structure may include multiple fins. Still alternatively, the first protrusion structure may include multiple ribs and the second protrusion structure may include multiple ribs. Thus, those skilled in the art would appreciate that, although the first protrusion structure includes fins 13 and the second protrusion structure includes ribs 14 as illustrated in FIG. 2, the scope of the present disclosure is not limited thereto.

Heat sink 102 may additionally include protrusions from any of the secondary sides, or edges, between the first side and the second side of the base portion. That is, heat sink 102 may include protrusions that protrude from the base portion of heat sink 102 in two or more different directions. For simplicity, heat sink 102 is illustrated to have protrusions on the first side and the second side of the base portion thereof. Thus, those skilled in the art would appreciate that, although heat sink 102 has first protrusion structure and second protrusion structure protruding from the first side and the second side thereof as illustrated in FIG. 2, the scope of the present disclosure is not limited thereto and may include additional protrusion structures protruding in different direction(s).

In the example shown in FIGS. 2A and 2B, fins 13 extend along a first direction on the first side of the base portion, and ribs 14 extend along the first direction on the second side of the base portion. That is, fins 13 and ribs 14 extend along the same direction and thus are parallel to each other.

Each of the fins 13 respectively has a base connected to the base portion of the heat sink 102. Each of the fins 13 also respectively has a tip opposite the base thereof. In heat sink 102, a surface connecting the tip and the base of a first fin that faces a second fin which is immediately adjacent the first fin is greater than 90° with respect to a plane defined by the first side of the base portion. As shown in FIG. 2B, the angle α2 is greater than 90°. This feature is applicable to each of the fins 13 in heat sink 102. That is, each of the fins 13 of heat sink 102 has one or two main surfaces facing its immediately adjacent fin, and the one or more main surfaces are not parallel to each other and are sloped with respect to the plane defined by the first side of the base portion. In other words, a width of the base and a width of the tip of each of the fins 13 viewed in the direction as shown in FIG. 2B are different (i.e., the width of the base is greater than the width of the tip). Put differently, each of the fins 13 has a generally trapezoidal profile in the cross-sectional view as shown in FIG. 2B.

Similarly, each of the ribs 14 respectively has a base connected to the base portion of the heat sink 102. Each of the ribs 14 also respectively has a tip opposite the base thereof. In heat sink 102, a surface connecting the tip and the base of a first rib that faces a second rib which is immediately adjacent the first rib is greater than 90° with respect to a plane defined by the second side of the base portion. As shown in FIG. 2B, the angle $\alpha 3$ is greater than 90°. This feature is applicable to each of the ribs 14 in heat sink 102. That is, each of the ribs 14 of heat sink 102 has one or two main surfaces facing its immediately adjacent rib, and the one or more main surfaces are not parallel to each other and are sloped with respect to the plane defined by the second side of the base portion. In other words, a width of the base and a width of the tip of each of the ribs 14 viewed in the direction as shown in FIG. 2B are different (i.e., the width of the base is greater than the width of the tip). Put differently, each of the ribs 14 has a generally trapezoidal profile in the cross-sectional view as shown in FIG. 2B.

In some embodiments, an amount of protrusion of a fin of the fins 13 measured from the first side of the base portion and an amount of protrusion of a rib of the ribs 14 measured from the second side of the base portion are different. As shown in FIGS. 2A and 2B, the height of fins 13 is greater than the height of ribs 14.

In some embodiments, an amount of protrusion of a first rib of the ribs 14 measured from the second side of the base portion and an amount of protrusion of a second rib of ribs 14 measured from the second side of the base portion may be different. That is, ribs 14 may have the same height or different heights.

In some embodiments, heat sink 102 is made of silicon such as, for example, single-crystal silicon. Alternatively, heat sink 102 is made of metal such as, for example, copper, aluminum or an alloy.

In the case that heat sink 102 is made of silicon, a silicon wafer may be fabricated by etching or plasma-etching to create the first protrusion structure and the second protrusion structure on opposing sides of the silicon wafer. The size and pitches of fins 13 and ribs 14 may be different. Ribs 14 are configured to attach to a heat source or heat spreader such as, for example, a PCB, metal heat-plate, heat-generating device, etc. so that heat is transferred from the heat source or heat spreader to heat sink 102 through ribs 14. Fins 13 are configured to dissipate the heat into the surrounding (e.g., air). Accordingly, fins 13 have a height greater than a height of ribs 14 to result in a total surface area of fins 13 to be much larger than a total surface area of ribs 14. This is because fins 13 need to dissipate heat into the surrounding. The area ratio of the height of fins 13 to the height of ribs 14 is thus at least greater than 1 in order to allow heat sink 102 to dissipate heat through fins 13. Otherwise, the heat may be accumulated in ribs 14.

Figure 3A:
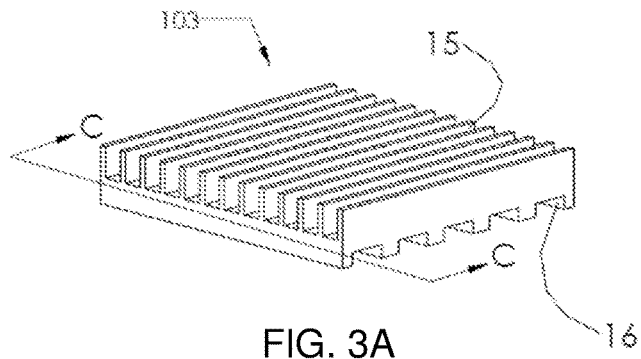
FIG. 3A is a perspective view of a heat sink in accordance with some embodiments of the present disclosure.
Figure 3B:
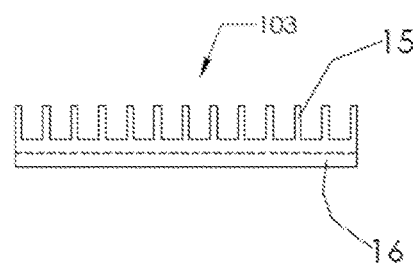
FIG. 3B is a cross-sectional view of the heat sink of FIG. 3A.

FIG. 3A is a perspective view of a heat sink 103 in accordance with some embodiments of the present disclosure. FIG. 3B is a cross-sectional view of heat sink 103 along the ling CC'.

Heat sink 103 may be implemented in a thermal management unit which will be described below. As shown in FIGS. 3A and 3B, heat sink 103 includes a base portion, a first protrusion structure and a second protrusion structure. The base portion may have a first side (e.g., the top side as shown in FIGS. 3A and 3B) and a second side (e.g., the bottom side as shown in FIGS. 3A and 3B) that is opposite the first side. The first protrusion structure protrudes from the first side of the base portion, and includes multiple fins 15. The second protrusion structure protrudes from the second side of the base portion, and includes multiple ribs 16. In some other embodiments, the first protrusion structure may include multiple ribs and the second protrusion structure may include multiple fins. Alternatively, the first protrusion structure may include multiple fins and the second protrusion structure may include multiple fins. Still alternatively, the first protrusion structure may include multiple ribs and the second protrusion structure may include multiple ribs. Thus, those skilled in the art would appreciate that, although the first protrusion structure includes fins 15 and the second protrusion structure includes ribs 16 as illustrated in FIG. 3, the scope of the present disclosure is not limited thereto.

Heat sink 103 may additionally include protrusions from any of the secondary sides, or edges, between the first side and the second side of the base portion. That is, heat sink 103 may include protrusions that protrude from the base portion of heat sink 103 in two or more different directions. For simplicity, heat sink 103 is illustrated to have protrusions on the first side and the second side of the base portion thereof. Thus, those skilled in the art would appreciate that, although heat sink 103 has first protrusion structure and second protrusion structure protruding from the first side and the second side thereof as illustrated in FIG. 3, the scope of the present disclosure is not limited thereto and may include additional protrusion structures protruding in different direction(s).

In the example shown in FIGS. 3A and 3B, fins 15 extend along a first direction on the first side of the base portion, and ribs 16 extend along a second direction on the second side of the base portion. The first direction and the second direction are different and may, for example, be orthogonal to one another. As shown in FIGS. 3A and 3B, fins 15 and ribs 16 extend along different, e.g., orthogonal, directions. This feature improves the strength of the structure of heat sink 103 to better withstand thermal stress or mechanical stress caused by soldering or epoxy bonding.

Each of the fins 15 respectively has a base connected to the base portion of the heat sink 103. Each of the fins 15 also respectively has a tip opposite the base thereof. In heat sink 103, a surface connecting the tip and the base of a first fin that faces a second fin which is immediately adjacent the first fin is approximately 90° with respect to a plane defined by the first side of the base portion. This feature is applicable to each of the fins 15 in heat sink 103. That is, each of the fins 15 of heat sink 103 has one or two main surfaces facing its immediately adjacent fin, and the one or more main surfaces are substantially parallel to each other and are substantially perpendicular to the plane defined by the first side of the base portion. In other words, a width of the base and a width of the tip of each of the fins 15 viewed in the direction as shown in FIG. 3B are substantially equal. Put differently, each of the fins 15 has a generally rectangular profile in the cross-sectional view as shown in FIG. 3B.

Similarly, each of the ribs 16 respectively has a base connected to the base portion of the heat sink 103. Each of the ribs 16 also respectively has a tip opposite the base thereof. In heat sink 103, a surface connecting the tip and the base of a first rib that faces a second rib which is immediately adjacent the first rib is approximately 90° with respect to a plane defined by the second side of the base portion. This feature is applicable to each of the ribs 16 in heat sink 103. That is, each of the ribs 16 of heat sink 103 has one or two main surfaces facing its immediately adjacent rib, and the one or more main surfaces are substantially parallel to each other and are substantially perpendicular to the plane defined by the second side of the base portion. In other words, a width of the base and a width of the tip of each of the ribs 16 viewed in the direction as shown in FIG. 3B are substantially equal. Put differently, each of the ribs 16 has a generally rectangular profile in the cross-sectional view as shown in FIG. 3B.

In some embodiments, an amount of protrusion of a fin of the fins 15 measured from the first side of the base portion and an amount of protrusion of a rib of the ribs 16 measured from the second side of the base portion are different. As shown in FIGS. 3A and 3B, the height of fins 15 is greater than the height of ribs 16.

In some embodiments, an amount of protrusion of a first rib of the ribs 16 measured from the second side of the base portion and an amount of protrusion of a second rib of ribs 16 measured from the second side of the base portion may be different. That is, ribs 16 may have the same height or different heights.

In some embodiments, heat sink 103 is made of silicon such as, for example, single-crystal silicon. Alternatively, heat sink 103 is made of metal such as, for example, copper, aluminum or an alloy.

In the case that heat sink 103 is made of silicon, a silicon wafer may be fabricated by etching or plasma-etching to create the first protrusion structure and the second protrusion structure on opposing sides of the silicon wafer. The size and pitches of fins 15 and ribs 16 may be different. Ribs 16 are configured to attach to a heat source or heat spreader such as, for example, a PCB, metal heat-plate, heat-generating device, etc. so that heat is transferred from the heat source or heat spreader to heat sink 103 through ribs 16. Fins 15 are configured to dissipate the heat into the surrounding (e.g., air). Accordingly, fins 15 have a height greater than a height of ribs 16 to result in a total surface area of fins 15 to be much larger than a total surface area of ribs 16. This is because fins 15 need to dissipate heat into the surrounding. The area ratio of the height of fins 15 to the height of ribs 16 is thus at least greater than 1 in order to allow heat sink 103 to dissipate heat through fins 15. Otherwise, the heat may be accumulated in ribs 16.

It is noteworthy that, although not illustrated in FIGS. 1-3, any, some or all of the fins and ribs of the heat sink of the present disclosure may have a shape different from those illustrated in FIGS. 1-3. For example, a heat sink in accordance with the present disclosure may have pin fins each of which having a generally cylindrical shape with straight side walls or a spike-like shape with tapered or sloped sidewalls. The same applies to the ribs. In other words, a heat sink in accordance with the present disclosure may have protrusions on multiple sides thereof, and the protrusions, whether fins or ribs, may have any conceivable shape that can be manufactured. For example, the fins may be straight fins, tapered or sloped fins, flared fins, pin fins, etc.

Figure 4:
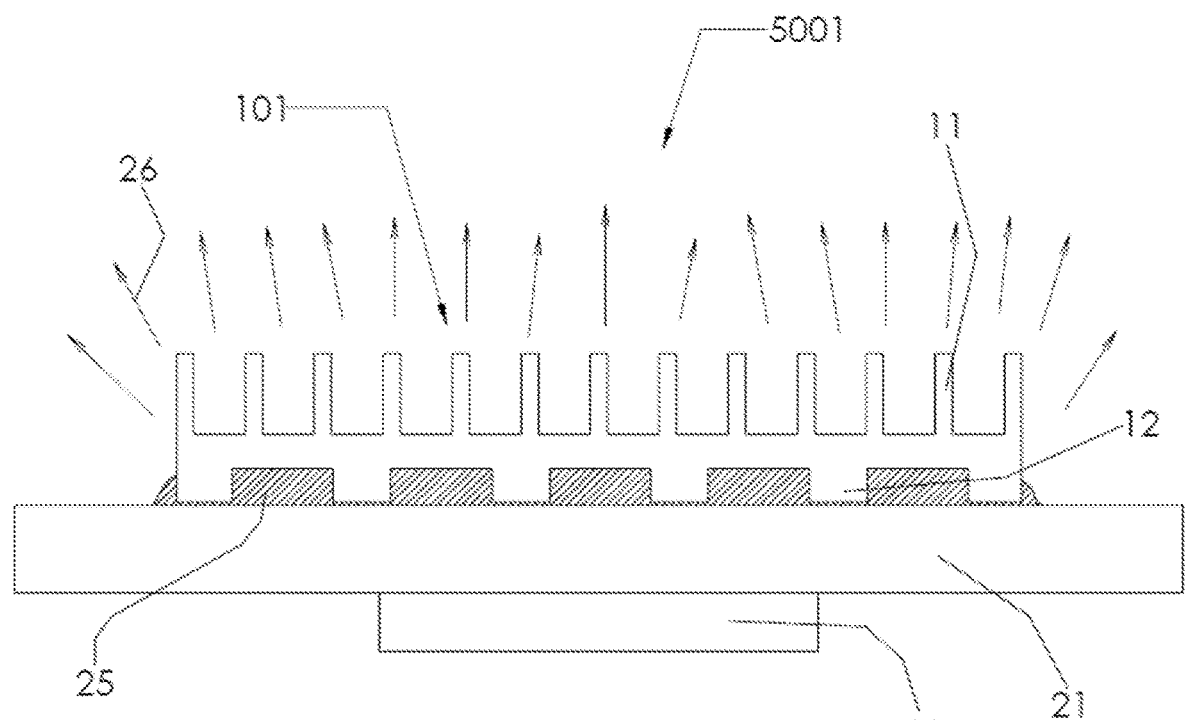
FIG. 4 is a side view of a thermal management assembly for an electronic apparatus and using a heat sink and a substrate in accordance with some embodiments of the present disclosure.

FIG. 4 is a side view of a thermal management assembly 5001 for an electronic apparatus and using heat sink 101 and a substrate 21 in accordance with some embodiments of the present disclosure. Although heat sink 101 is illustrated in the example shown in FIG. 4, in other embodiments, heat sink 102 or heat sink 103 may be utilized in place of heat sink 101.

Thermal management assembly 5001 includes a main unit and a thermal management unit. The main unit includes the substrate 21 and at least one heat-generating device 22. Substrate 21 may be a PCB. The at least one heat-generating device 22 may include one or more compact devices such as, for example, integrated-circuits (including microprocessors, graphics chips, memory chips, RF chips, networking communication chips, microwave chips, navigation chips, etc.), laser diodes, LEDs and VCSELs. Substrate 21 has a first side (e.g., top side as shown in FIG. 4) and a second side (e.g., bottom side as shown in FIG. 4) that is opposite the first side. Each of the at least one heat-generating device 22 is disposed on the second side (e.g., bottom side) of substrate 21. Substrate 21 is generally electrically insulating and thermally conductive.

Thermal management unit of thermal management assembly 5001 includes one or more heat sinks each of which includes protrusions (e.g., fins and/or ribs) on multiple sides thereof. The one or more heat sinks of thermal management assembly 5001 may include, for example, heat sink 101, heat sink 102 and/or heat sink 103. Thus, in the interest of brevity, detailed description of the heat sink of thermal management unit is not repeated. Those skilled in the art would appreciate that, although heat sink 101 is illustrated in FIG. 4, the scope of the present disclosure is not limited thereto. Further, for simplicity, one heat sink and one heat-generating device are illustrated in FIG. 4 and described below in reference to FIG. 4, although the technique of the present disclosure also applies to scenarios in which there are multiple heat sinks and/or multiple heat-generating devices disposed on substrate 21.

As shown in FIG. 4, heat sink 101 is disposed, attached, or otherwise mounted on the first side (e.g., top side) of substrate 21. Preferably, heat sink 101 is disposed at a location on the first side of substrate 21 opposite the location on the second side of substrate 21 at which the at least one heat-generating device 22 is disposed. Heat sink 101 may be bonded to substrate 21 with medium 25, e.g., at the bottom side of the ribs 12 and base portion of heat sink 101 as shown in FIG. 4. The use of medium 25 creates a heat transfer path of low thermal resistance between substrate 21 and heat sink 101. This maximizes heat transfer from substrate 21 to heat sink 101. Medium 25 may be, for example, thermal epoxy or thermal grease. It is perceived that most of the heat generated by the at least one heat-generating device 22 will flow through substrate 21 and transfer to ribs 12 of heat sink 101, while some amount of heat will flow through medium 25 and transfer to fins 11 and base portion of heat sink 101. Fins 11 will radiate the heat into the surrounding, e.g., air. An illustrative pattern of heat dissipation 26 is shown in FIG. 4 as it may be naturally radiated and/or convected to the air by forced-air from a fan or another means.

Figure 5:
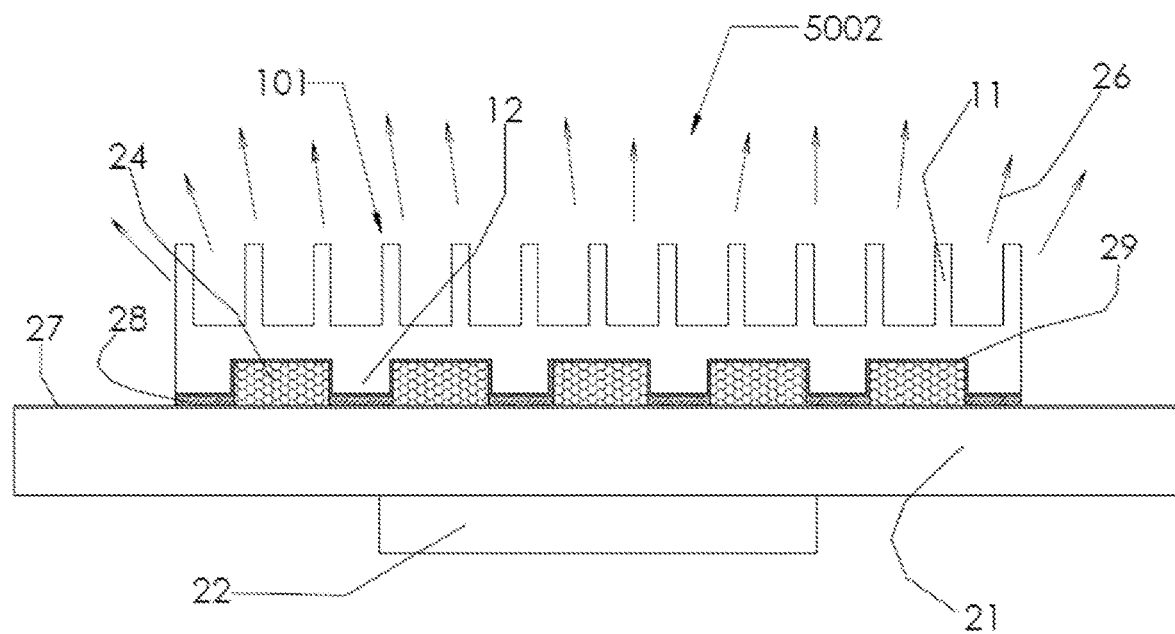
FIG. 5 is a side view of another thermal management assembly for an electronic apparatus and using a heat sink and a substrate in accordance with some embodiments of the present disclosure.

FIG. 5 is a side view of a thermal management assembly 5002 for an electronic apparatus and using heat sink 101 and substrate 21 in accordance with some embodiments of the present disclosure. Although heat sink 101 is illustrated in the example shown in FIG. 5, in other embodiments, heat sink 102 or heat sink 103 may be utilized in place of heat sink 101.

Thermal management assembly 5002 includes a main unit and a thermal management unit. The main unit includes the substrate 21 and at least one heat-generating device 22. Substrate 21 may be a PCB. The at least one heat-generating device 22 may include one or more compact devices such as, for example, integrated-circuits (including microprocessors, graphics chips, memory chips, RF chips, networking communication chips, microwave chips, navigation chips, etc.), laser diodes, LEDs and VCSELs. Substrate 21 has a first side (e.g., top side as shown in FIG. 5) and a second side (e.g., bottom side as shown in FIG. 5) that is opposite the first side. Each of the at least one heat-generating device 22 is disposed on the second side (e.g., bottom side) of substrate 21. Substrate 21 is generally electrically insulating and thermally conductive.

Thermal management unit of thermal management assembly 5002 includes one or more heat sinks each of which includes protrusions (e.g., fins and/or ribs) on multiple sides thereof. The one or more heat sinks of thermal management assembly 5002 may include, for example, heat sink 101, heat sink 102 and/or heat sink 103. Thus, in the interest of brevity, detailed description of the heat sink of thermal management unit is not repeated. Those skilled in the art would appreciate that, although heat sink 101 is illustrated in FIG. 5, the scope of the present disclosure is not limited thereto. Further, for simplicity, one heat sink and one heat-generating device are illustrated in FIG. 5 and described below in reference to FIG. 5, although the technique of the present disclosure also applies to scenarios in which there are multiple heat sinks and/or multiple heat-generating devices disposed on substrate 21.

As shown in FIG. 5, heat sink 101 is disposed, attached, or otherwise mounted on the first side (e.g., top side) of substrate 21. Preferably, heat sink 101 is disposed at a location on the first side of substrate 21 opposite the location on the second side of substrate 21 at which the at least one heat-generating device 22 is disposed.

At least a portion of the first side of substrate 21 is metalized with a metal layer 27. For example, the portion of the first side of substrate 21 that corresponds to heat sink 101 may be coated with metal layer 27. Alternatively, the entire or a majority of the first side of substrate 21 may be coated with metal layer 27. Correspondingly, at least a portion of the bottom side of heat sink 101, which faces the first side of substrate 21 as shown in FIG. 5, is metalized with a metal layer. As shown in FIG. 5, the bottom surface of the tip of each of ribs 12 and the bottom surface of the base portion of heat sink 101 are coated with a metal layer 29. Metal layer 27 and metal layer 29 may be coated on substrate 21 and heat sink 101, respectively, by metal deposition or metal-spray. Medium 28 is used to bond metal layer 27 on substrate 21 to the portion of metal 29 that is on the bottom surface of the tip of each of ribs 12. Medium 24 is used to bond metal layer 27 on substrate 21 to the portion of metal 29 that is on the bottom surface of the base portion of heat sink 101. Medium 24 also fills in a space defined by the first side of substrate 21 and a gap between every two immediately adjacent ribs 12 of heat sink 101. The use of medium 28 and medium 24 creates a heat transfer path of low thermal resistance between substrate 21 and heat sink 101. This maximizes heat transfer from substrate 21 to heat sink 101. Medium 28 may be solder and medium 24 may be thermal epoxy or solder. It is perceived that most of the heat generated by the at least one heat-generating device 22 will flow through substrate 21 and transfer to ribs 12 of heat sink 101, while some amount of heat will flow through medium 24 and transfer to fins 11 and base portion of heat sink 101. Fins 11 will radiate the heat into the surrounding, e.g., air. An illustrative pattern of heat dissipation 26 is shown in FIG. 5 as it may be naturally radiated and/or convected to the air by forced-air from a fan or another means.

Figure 6A:
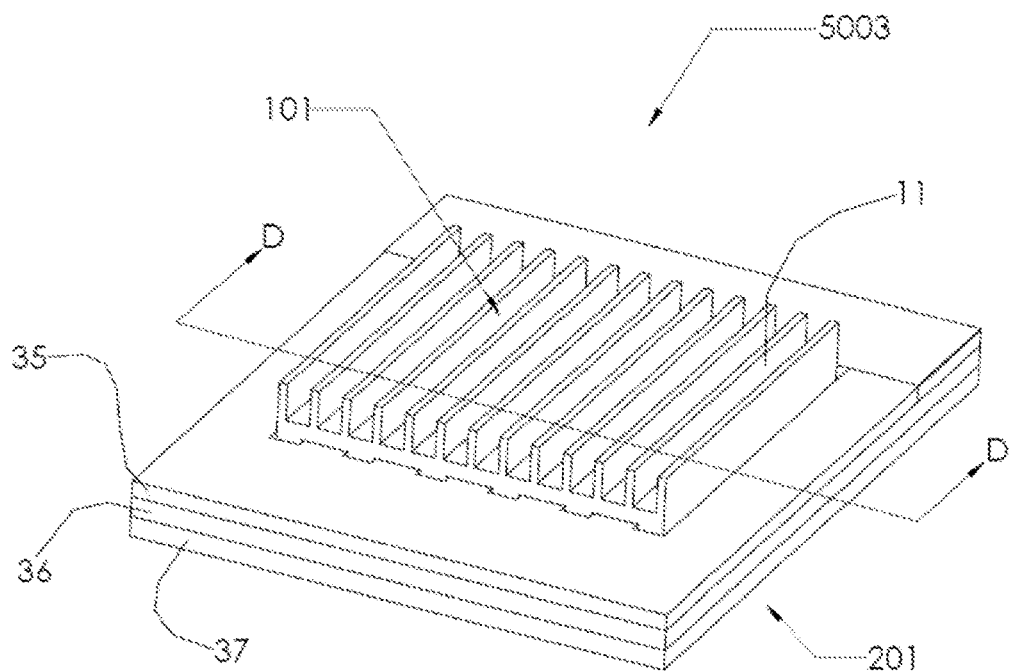
FIG. 6A is a top perspective view of a thermal management assembly for an electronic apparatus and using a heat sink and a substrate in accordance with some embodiments of the present disclosure.
Figure 6B:
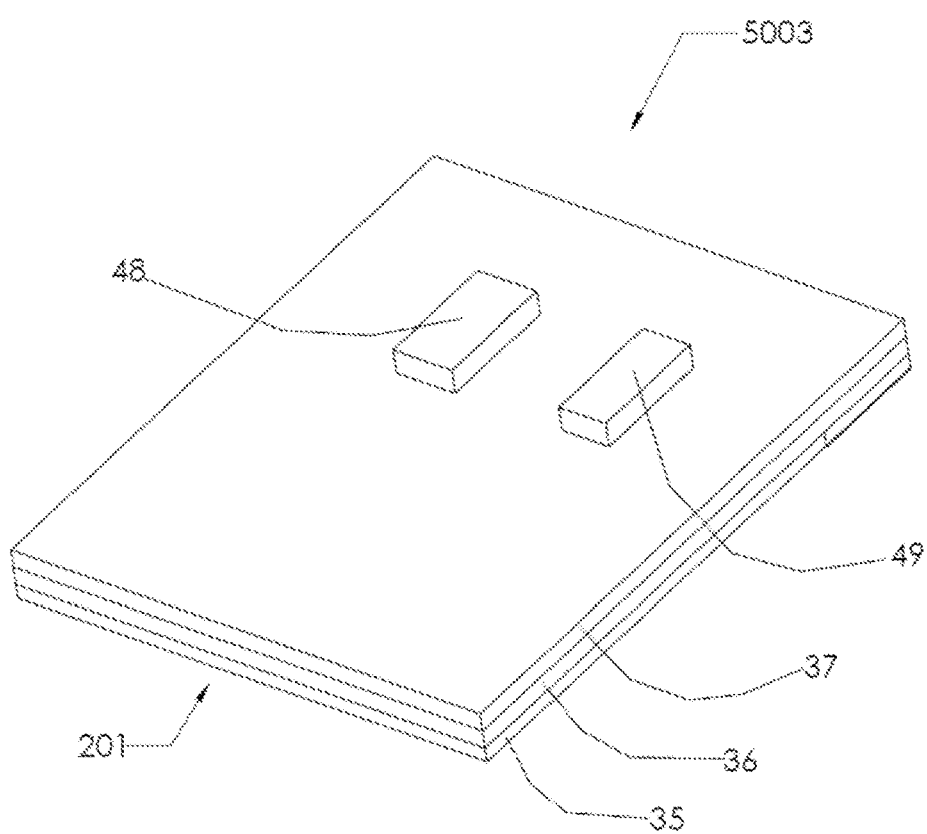
FIG. 6B is a bottom perspective view of the thermal management assembly of FIG. 6A.

FIG. 6A is a top perspective view of a thermal management assembly 5003 for an electronic apparatus and using heat sink 101 and a substrate 201 in accordance with some embodiments of the present disclosure. FIG. 6B is a bottom perspective view of thermal management assembly 5003 of FIG. 6A.

Thermal management assembly 5003 includes a main unit and a thermal management unit. The main unit includes the substrate 201 and at least one heat-generating device (e.g., a first heat-generating device 48 and a second heat-generating device 49 are shown as an example). Substrate 201 may be a PCB. The at least one heat-generating device may include one or more compact devices such as, for example, integrated-circuits (including microprocessors, graphics chips, memory chips, RF chips, networking communication chips, microwave chips, navigation chips, etc.), laser diodes, LEDs and VCSELs. Substrate 201 has a first side (e.g., top side as shown in FIGS. 6A and 6B) and a second side (e.g., bottom side as shown in FIGS. 6A and 6B) that is opposite the first side. Each of the at least one heat-generating device is disposed on the second side (e.g., bottom side) of substrate 201. Substrate 201 is thermally conductive.

Thermal management unit of thermal management assembly 5003 includes one or more heat sinks each of which includes protrusions (e.g., fins and/or ribs) on multiple sides thereof. The one or more heat sinks of thermal management assembly 5003 may include, for example, heat sink 101, heat sink 102 and/or heat sink 103. Thus, in the interest of brevity, detailed description of the heat sink of thermal management unit is not repeated. Those skilled in the art would appreciate that, although heat sink 101 is illustrated in FIGS. 6A and 6B, the scope of the present disclosure is not limited thereto. Further, for simplicity, one heat sink and one heat-generating device are illustrated in FIGS. 6A/6B and described below in reference to FIGS. 6A and 6B, although the technique of the present disclosure also applies to scenarios in which there are multiple heat sinks and/or fewer or more heat-generating devices disposed on substrate 201.

As shown in FIGS. 6A and 6B, substrate 201 includes multiple layers. Substrate 201 may be, for example, a multi-layered PCB. That is, substrate 201 may be a multi-layered PCB with multiple layers therein. That is, substrate 201 may be a multi-layered structure having layers of electrically-conductive layers (e.g., one or more layers of metal) and electrically-insulating layers (e.g., one or more layers of insulator) interlaced or otherwise sandwiched in an alternating fashion. In the example shown in FIGS. 6A and 6B, substrate 201 has three electrically-insulating layers. Those skilled in the art would appreciate that, although substrate 201 is illustrated to have three electrically-insulating layers in FIGS. 6A and 6B, the scope of the present disclosure is not limited thereto. For example, substrate 201 may have fewer (e.g., two) or more (e.g., four or more) layers than what is illustrated in FIGS. 6A and 6B.

As shown in FIGS. 6A and 6B, substrate 201 includes a first layer 35 (e.g., the top layer) on which heat sink 101 is disposed, a second layer 36 (e.g., the middle layer) and a third layer 37 (e.g., the bottom layer) on which at least one heat-generating device, such as a first heat-generating device 48 and a second heat-generating device 49, is disposed. Second layer 36 sandwiched between first layer 35 and third layer 37. First layer 35 of substrate 201 may be patterned to receive, accommodate, fit or otherwise engage with heat sink 101. For example, the side of first layer 35 that constitute the first side (e.g., top side) of substrate 201 may include grooves, indentations and/or through-holes that are shaped and contoured to accommodate ribs 12 and the bottom side of the base portion of heat sink 101. This allows substrate 201 to interlockingly receive, accommodate, fit or otherwise engage with heat sink 101. In other words, first layer 35 of substrate 201 is patterned so that substrate 201 and heat sink 101 interlock with each other when heat sink 101 is disposed on the first side of substrate 201. This feature increases the total surface area in contact between substrate 201 and heat sink 101 to maximize heat transfer from substrate 201 to heat sink 101. This feature also increases the structural strength of heat sink 201 as well as mechanical integrity of thermal management assembly 5003.

Figure 7:
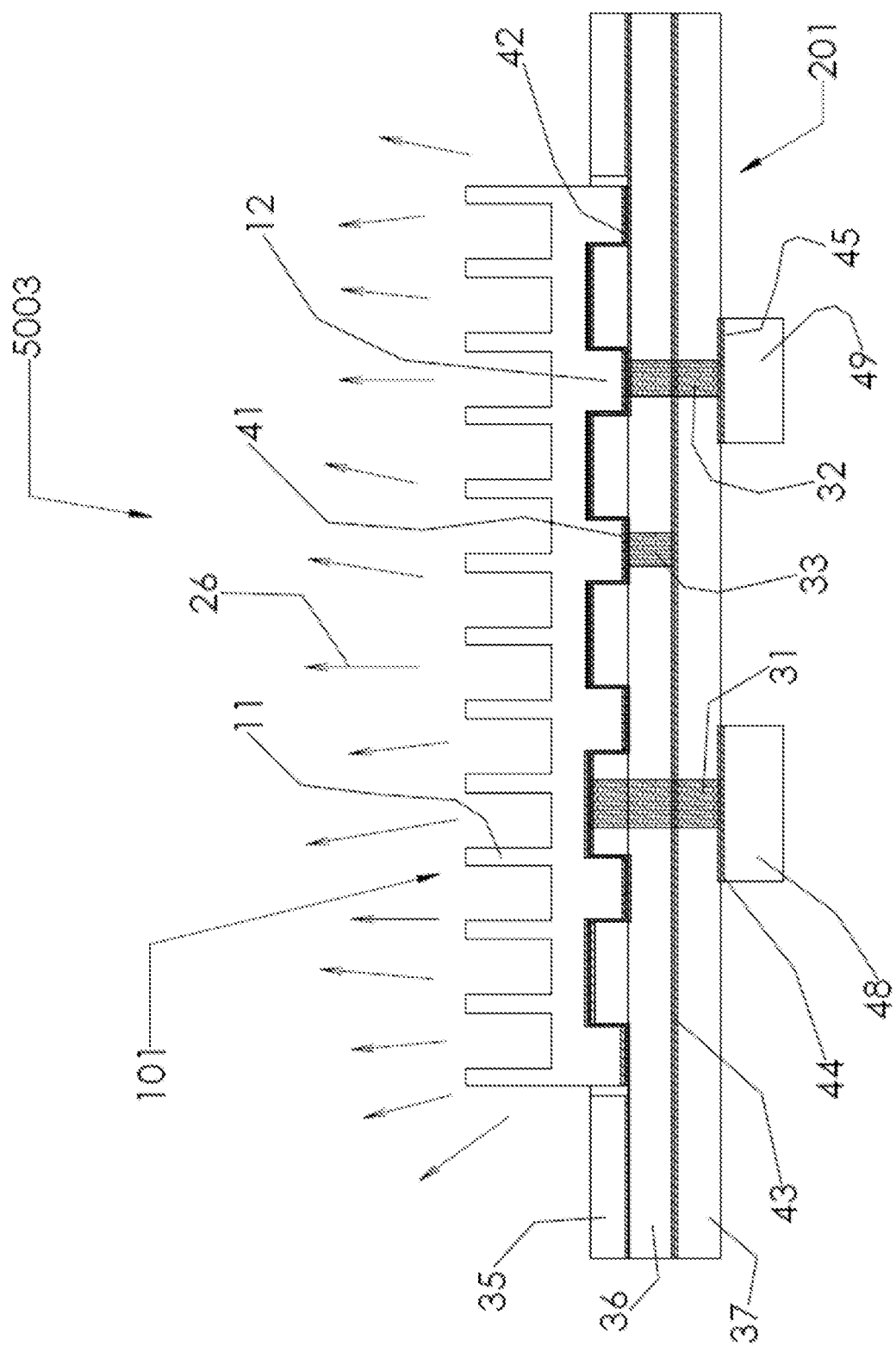
FIG. 7 is a cross-sectional view of a thermal management assembly for an electronic apparatus and using a heat sink and a substrate in accordance with some embodiments of the present disclosure.

FIG. 7 is a cross-sectional view of thermal management assembly 5003. As shown in FIG. 7, a metal layer 41 (e.g., copper layer) is coated on solder joints between the bottom surface of the tip of each rib 12 and substrate 201 (e.g., first layer 35 and/or second layer 36, where ribs 12 come in contact with substrate 201). The bottom surface of the tip of each rib 12 may be metalized and bonded to substrate 201 (e.g., first layer 35 and/or second layer 36) by medium 42. For example, medium 42 may be solder when ribs 12 are soldered to substrate 201, and medium 42 may be thermal epoxy when ribs 12 are epoxied to substrate 201. Likewise, as shown in FIG. 7, first heat-generating device 48 and second heat-generating device 49 may be bonded to the second side of substrate 201 (e.g., third layer 37) by medium 44. Medium 44 may be, for example, solder when first heat-generating device 48 and second heat-generating device 49 are soldered onto substrate 201. The side of each of first heat-generating device 48 and second heat-generating device 49 that faces substrate 201 may be metalized with a metal layer 45.

Substrate 201 includes one or more thermal vias (e.g., thermal vias 31, 32 and 33 as shown in FIG. 7) that traverse a thickness of the substrate. Some of the thermal vias (e.g., thermal vias 31 and 32) traverse through the entire thickness of substrate 201, i.e., from the first side of substrate 201 to the second side of substrate 201, while other thermal vias (e.g., thermal via 33) traverse through a portion of but not the entire thickness of substrate 201. In some embodiments, at least one of the one or more thermal vias may correspond to a respective one of the at least one heat-generating device and may be configured to conduct heat from the respective one of the at least one heat-generating device in a direction from the second side of substrate 201 toward the first side of substrate 201. Each of the one or more thermal vias includes a thermally-conductive material. The thermally-conductive material may be metal such as, for example, copper. Although three thermal vias (i.e., thermal vias 31, 32 and 33) are illustrated in FIG. 7, in actual implementations substrate 201 may include fewer or more thermal vias. Therefore, the scope of thermal management assembly 5003 in accordance with the present disclosure is not limited to what is illustrated in FIG. 7.

As shown in FIG. 7, first layer 35 of substrate 201 is patterned with through-holes to accommodate, and thus interlock with, ribs 12 of heat sink 101. In the illustrated example, as first layer 35 of substrate 201 has through-holes, the metalized bottom surface of the tip of each rib 12 is bonded to second layer 36 of substrate 201. The surface of second layer 36 facing heat sink 101, e.g., the portion of the top surface of second layer 36 in contact with ribs 12, may be metalized with a metal layer 43. Accordingly, second layer 36 can directly dissipate heat into heat sink 101 without going through the thermal vias (e.g., thermal vias 31, 32). The interlock between ribs 12 of heat sink 101 and first layer 35 of substrate 201 provides more surface area for paths of heat transfer via conduction from substrate 201 to heat sink 101. This feature increases the rate of heat transfer as well as improves structural strength of heat sink 101.

As thermal vias 31 and 32 are aligned with first heat-generating device 48 and second heat-generating device 49, respectively, heat generated by first heat-generating device 48 and second heat-generating device 49 can be transferred to heat sink 101 through thermal vias 31 and 32. Moreover, heat absorbed by substrate 201 and trapped between second layer 36 and third layer 37 can be transferred to heat sink 101 through thermal via 33. This feature enables efficient and effective heat transfer from first heat-generating device 48 and second heat-generating device 49 to heat sink 101, and from substrate 201 to heat sink 101.

Figure 8:
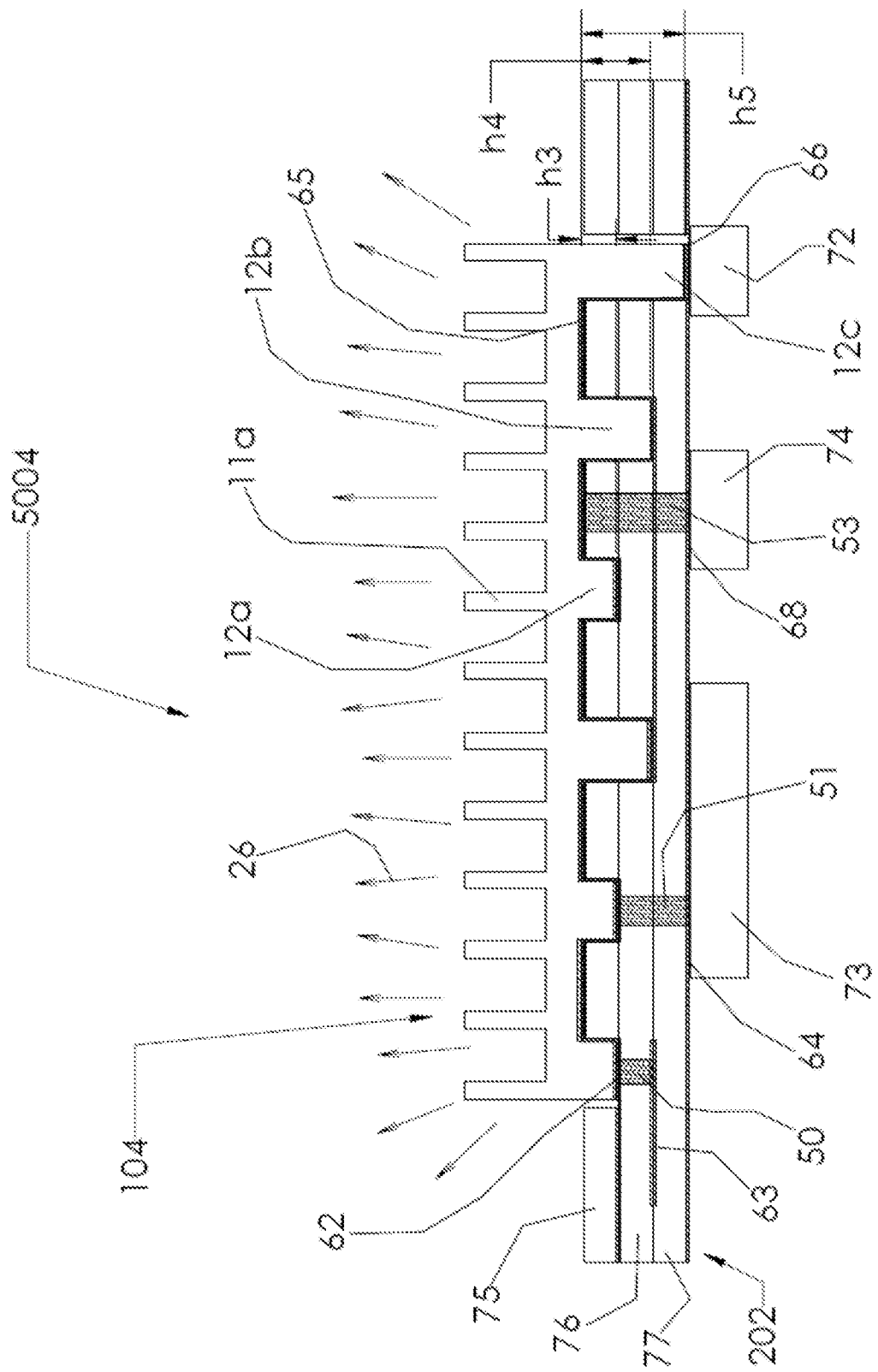
FIG. 8 is a cross-sectional view of another thermal management assembly for an electronic apparatus and using a heat sink and a substrate in accordance with some embodiments of the present disclosure.

FIG. 8 is a cross-sectional view of a thermal management assembly 5004 for an electronic apparatus and using a heat sink 104 and a substrate 202 in accordance with some embodiments of the present disclosure.

Thermal management assembly 5004 includes a main unit and a thermal management unit. The main unit includes the substrate 202 and at least one heat-generating device (e.g., a first heat-generating device 72, a second heat-generating device 73 and a third heat-generating device 74 are shown as an example). Substrate 202 may be a PCB. The at least one heat-generating device may include one or more compact devices such as, for example, integrated-circuits (including microprocessors, graphics chips, memory chips, RF chips, networking communication chips, microwave chips, navigation chips, etc.), laser diodes, LEDs and VCSELs. Substrate 202 has a first side (e.g., top side as shown in FIG. 8) and a second side (e.g., bottom side as shown in FIG. 8) that is opposite the first side. Each of the at least one heat-generating device is disposed on the second side (e.g., bottom side) of substrate 202. Substrate 202 is thermally conductive.

Thermal management unit of thermal management assembly 5004 includes one or more heat sinks each of which includes protrusions (e.g., fins and/or ribs) on multiple sides thereof. The one or more heat sinks of thermal management assembly 5004 may include, for example, heat sink 101, heat sink 102, heat sink 103 and/or heat sink 104. In the example shown in FIG. 8, heat sink 104 is utilized. In the interest of brevity, detailed description of features of heat sink 104 similar to those of heat sink 101/102/103 are not repeated. While heat sink 104 has fins 11a on the first side (e.g., top side as shown in FIG. 8) that may have the same height, heat sink has short ribs 12a, medium ribs 12b and long ribs 12c on the second side (e.g., bottom side as shown in FIG. 8). Fins 11a may have straight or sloped side walls. Ribs 12a/12b/12c may have straight or sloped side walls. In the example shown in FIG. 8, fins 11a and ribs 12a/12b/12c have straight side walls.

Those skilled in the art would appreciate that, although heat sink 104 is illustrated in FIG. 8, the scope of the present disclosure is not limited thereto. Further, for simplicity, one heat sink and three heat-generating devices are illustrated in FIG. 8 and described below in reference to FIG. 8, although the technique of the present disclosure also applies to scenarios in which there are multiple heat sinks and/or fewer or more heat-generating devices disposed on substrate 202.

As shown in FIG. 8, substrate 202 includes multiple layers. Substrate 202 may be, for example, a multi-layered PCB. That is, substrate 202 may be a multi-layered PCB with multiple layers therein. That is, substrate 202 may be a multi-layered structure having layers of electrically-conductive layers (e.g., one or more layers of metal) and electrically-insulating layers (e.g., one or more layers of insulator) interlaced or otherwise sandwiched in an alternating fashion. In the example shown in FIG. 8, substrate 202 has three electrically-insulating layers. Those skilled in the art would appreciate that, although substrate 201 is illustrated to have three electrically-insulating layers in FIG. 8, the scope of the present disclosure is not limited thereto. For example, substrate 202 may have fewer (e.g., two) or more (e.g., four or more) layers than what is illustrated in FIG. 8.

As shown in FIG. 8, substrate 202 includes a first layer 75 (e.g., the top layer) on which heat sink 104 is disposed, a second layer 76 (e.g., the middle layer) and a third layer 77 (e.g., the bottom layer) on which at least one heat-generating device, such as first heat-generating device 72, second heat-generating device 73 and third heat-generating device 74, is/are disposed. Second layer 76 is sandwiched between first layer 75 and third layer 77. First layer 75, second layer 76 and third layer 77 of substrate 202 may be patterned to receive, accommodate, fit or otherwise engage with heat sink 104. For example, the side of first layer 75, second layer 76 and third layer 77 that face toward heat sink 104 (e.g., top side) may include grooves, indentations and/or through-holes that are shaped and contoured to accommodate ribs 12a/12b/12c and the bottom side of the base portion of heat sink 104. This allows substrate 202 to interlockingly receive, accommodate, fit or otherwise engage with heat sink 104. In other words, first layer 75, second layer 76 and third layer 77 of substrate 202 are respectively patterned so that substrate 202 and heat sink 104 interlock with each other when heat sink 104 is disposed on the first side of substrate 202. This feature increases the total surface area in contact between substrate 202 and heat sink 104 to maximize heat transfer from substrate 202 to heat sink 104. This feature also increases the structural strength of heat sink 104 as well as mechanical integrity of thermal management assembly 5004.

As shown in FIG. 8, a metal layer 65 (e.g., copper layer) is coated on solder joints between the bottom surface of heat sink 104 between ribs 12 and substrate 202 (e.g., first layer 35 and/or second layer 36, where ribs 12a/12b/12c come in contact with substrate 202). The bottom surface of the tip of each rib 12a/12b/12c may be metalized and bonded to substrate 202 (e.g., first layer 75, second layer 76 and/or third layer 77) by medium 62. For example, medium 62 may be solder when ribs 12a/12b/12c are soldered to substrate 202, and medium 62 may be thermal epoxy when ribs 12a/12b/12c are epoxied to substrate 202. Likewise, as shown in FIG. 8, first heat-generating device 72, second heat-generating device 73 and third heat-generating device 74 may be bonded to the second side of substrate 202 (e.g., third layer 77) by medium 64. Medium 64 may be, for example, solder when first heat-generating device 72, second heat-generating device 73 and third heat-generating device 74 are soldered onto substrate 202. The side of each of first heat-generating device 72, second heat-generating device 73 and third heat-generating device 74 that faces substrate 202 may be metalized with a metal layer 68. At least a portion of the second side of substrate 202, e.g., the portion of the second side that bonds with first heat-generating device 72, second heat-generating device 73 and third heat-generating device 74, may be coated with a metal layer 66.

Substrate 202 includes one or more thermal vias (e.g., thermal vias 50, 51 and 53 as shown in FIG. 8) that traverse a thickness of the substrate. Some of the thermal vias (e.g., thermal via 53) traverse through the entire thickness of substrate 202, i.e., from the first side of substrate 202 to the second side of substrate 202, while other thermal vias (e.g., thermal vias 50 and 51) traverse through a portion of but not the entire thickness of substrate 202. In some embodiments, at least one of the one or more thermal vias may correspond to a respective one of the at least one heat-generating device and may be configured to conduct heat from the respective one of the at least one heat-generating device in a direction from the second side of substrate 202 toward the first side of substrate 202. Each of the one or more thermal vias includes a thermally-conductive material. The thermally-conductive material may be metal such as, for example, copper. Although three thermal vias (i.e., thermal vias 50, 51 and 53) are illustrated in FIG. 8, in actual implementations substrate 202 may include fewer or more thermal vias. Therefore, the scope of thermal management assembly 5004 in accordance with the present disclosure is not limited to what is illustrated in FIG. 8.

As shown in FIG. 8, first layer 75 of substrate 202 is patterned with through-holes to accommodate, and thus interlock with, ribs 12 of heat sink 104. In the illustrated example, as first layer 75 of substrate 202 has through-holes, the metalized bottom surface of the tip of each rib 12a is bonded to second layer 76 of substrate 202. The surface of second layer 76 facing heat sink 104, e.g., the portion of the top surface of second layer 76 in contact with ribs 12a, may be metalized with a metal layer. Accordingly, second layer 76 can directly dissipate heat into heat sink 104 without going through the thermal vias (e.g., thermal vias 51, 53). The interlock between ribs 12a/12b/12c of heat sink 104 and first layer 75, second layer 76 and third layer 77 of substrate 202 provides more surface area for paths of heat transfer via conduction from substrate 202 to heat sink 104. This feature increases the rate of heat transfer as well as improves structural strength of heat sink 104.

As thermal vias 51 and 53 are aligned with second heat-generating device 73 and third heat-generating device 74, respectively, heat generated by second heat-generating device 73 and third heat-generating device 74 can be transferred to heat sink 104 through thermal vias 51 and 53. Moreover, heat absorbed by substrate 202 and trapped between second layer 76 and third layer 77 can be transferred to heat sink 104 through thermal via 50. This feature enables efficient and effective heat transfer from second heat-generating device 73 and third heat-generating device 74 to heat sink 104, and from substrate 202 to heat sink 104.

Thermal management assembly 5004 of FIG. 8 differs from thermal management assembly 5003 of FIG. 7 mainly due to ribs 12a/12b/12c having different heights as measured from the second side of heat sink 104. As shown in FIG. 8, ribs 12a have a height h3, ribs 12b have a height h4, and ribs 12c have a height h5. Thus, ribs 12a/12b/12c extend to and are bonded to (e.g., by soldering) to different layers of substrate 202. For example, ribs 12a are soldered to a metal layer 62 at the top side of second layer 76 and other solder joints to remove heat from the metal layer between first layer 75 and second layer 76. Ribs 12b are soldered to a metal layer 63 at the top side of third layer 77 and other solder joints to remove heat from the metal layer between second layer 76 and third layer 77. As shown in FIG. 8, a rib 12c extends or traverses the entire thickness of substrate 202 to directly connect to first heat-generating device 72 through metal layer 66. In other words, ribs 12a/12b/12c, having different heights h3, h4 and h5, can directly connect to any metallization of the multiple layers of substrate 202 to effectively transfer heat into heat sink 104 to dissipate the heat into the surrounding, e.g., air. This feature allows thermal management assembly 5004 to isolate heat from the various heat-generating devices and to spread the heat around the layers of substrate 202. The heights h3/h4/h5 of ribs 12a/12b/12c are related to the thickness of first layer 75, second layer 76 and third layer 77, respectively. Thermal vias 50, 51 and 53 are also used to transfer heat that is trapped in any layer of the multi-layered substrate 202.

Figure 9:
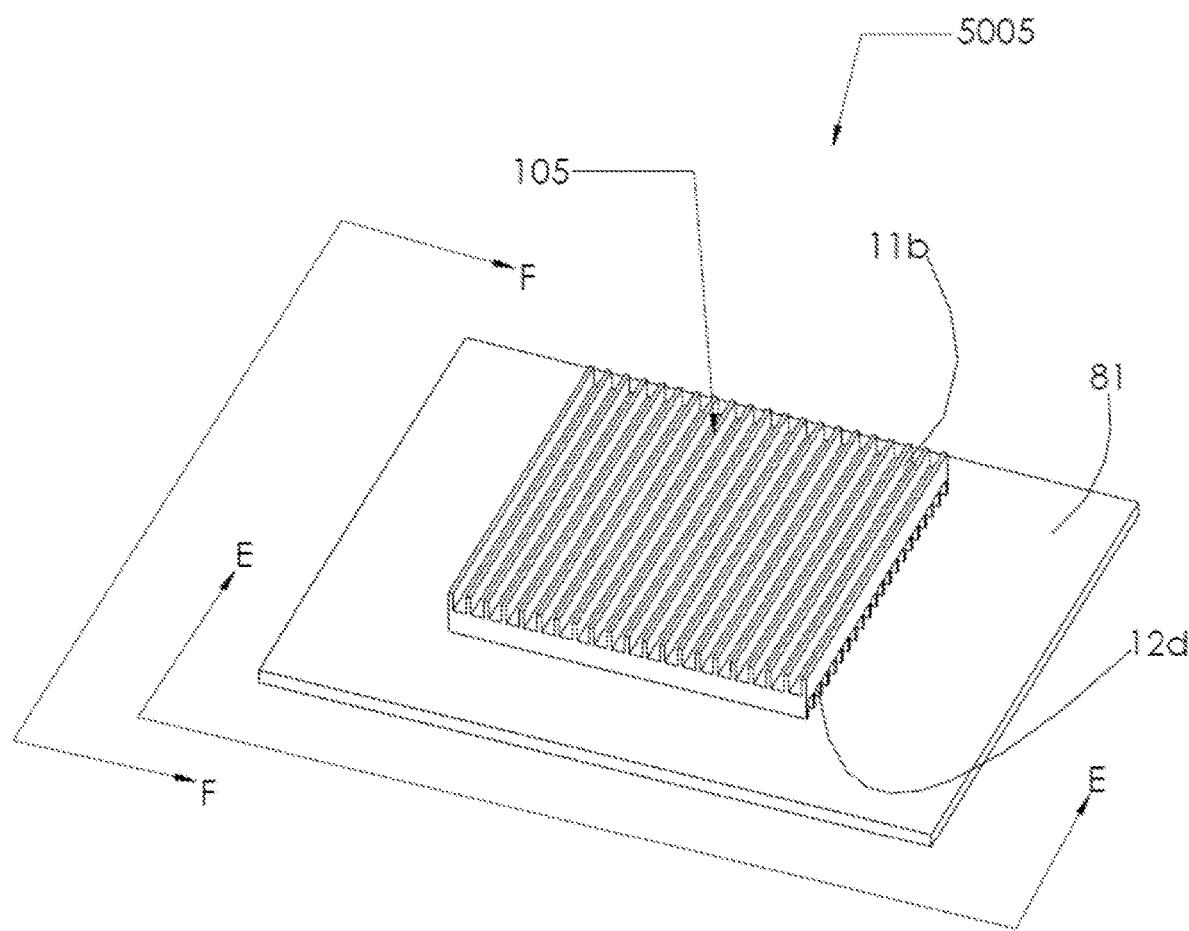
FIG. 9 is a perspective view of a thermal management assembly for an electronic apparatus and using a heat sink in accordance with some embodiments of the present disclosure.
Figure 10:
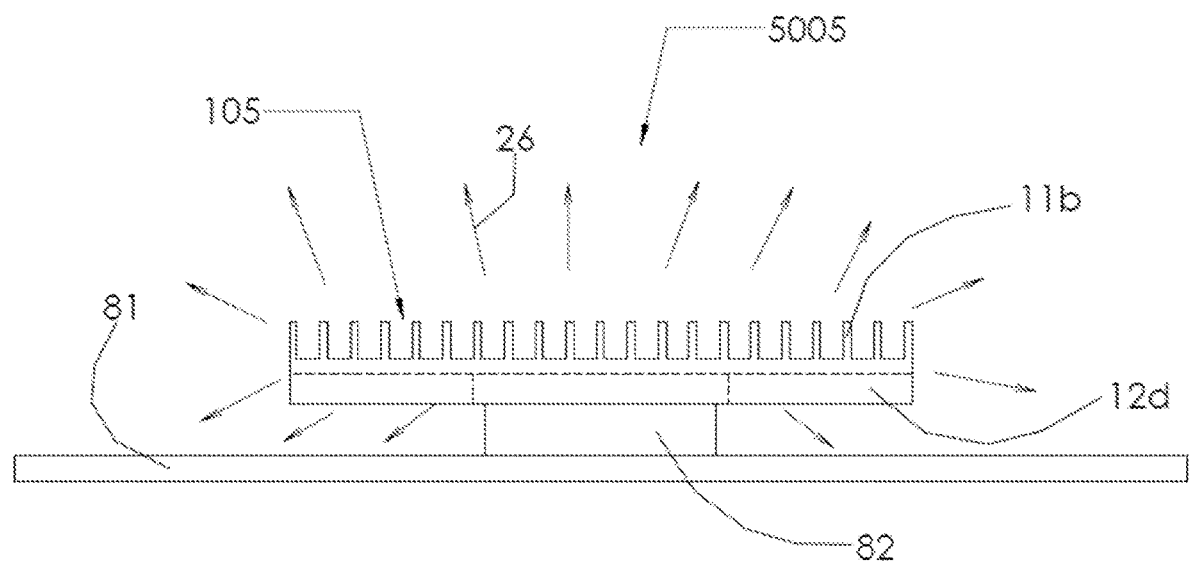
FIG. 10 is a first cross-sectional view of the thermal management assembly of FIG. 9, viewing from a first direction.
Figure 11:
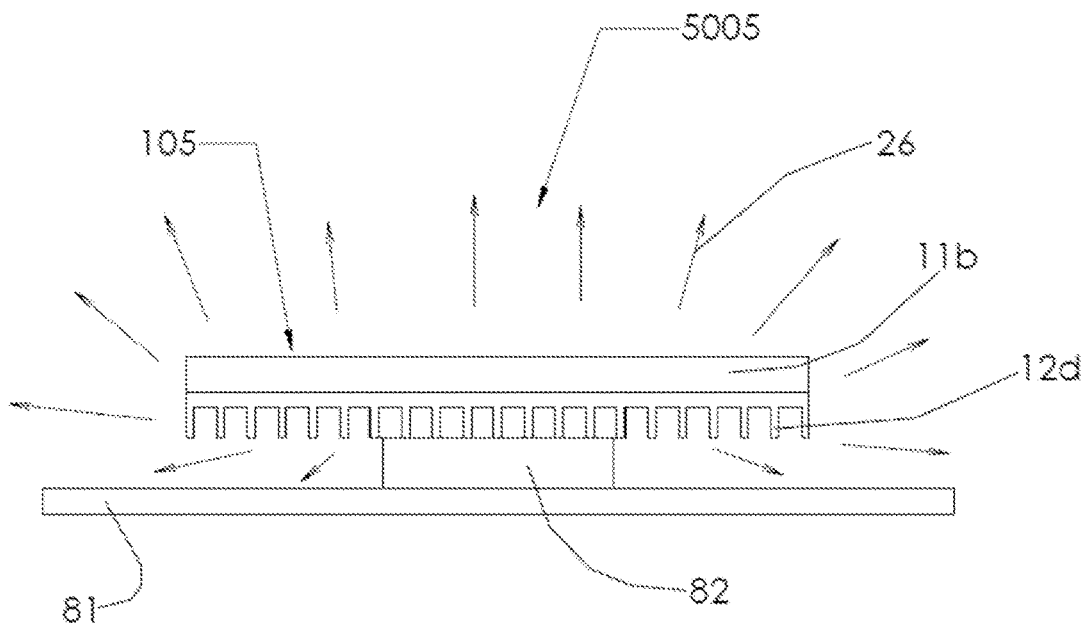
FIG. 11 is a second cross-sectional view of the thermal management assembly of FIG. 9, viewing from a second direction that is orthogonal to the first direction.

FIG. 9 is a perspective view of a thermal management assembly 5005 for an electronic apparatus and using a heat sink 105 in accordance with some embodiments of the present disclosure. FIG. 10 is a first cross-sectional view of thermal management assembly 5005 of FIG. 9 along line EE. FIG. 11 is a second cross-sectional view of thermal management assembly 5005 of FIG. 9 along line FF on the second side (e.g., bottom side) of substrate 202. Substrate 202 is thermally.

Thermal management assembly 5005 includes a main unit and a thermal management unit. The main unit includes the substrate 81 and at least one heat-generating device (e.g., a heat-generating device 82 is shown as an example). Substrate 81 may be a PCB. The at least one heat-generating device may include one or more compact devices such as, for example, integrated-circuits (including microprocessors, graphics chips, memory chips, RF chips, networking communication chips, microwave chips, navigation chips, etc.), laser diodes, LEDs and VCSELs. Substrate 81 has a first side (e.g., top side as shown in FIGS. 9-11) and a second side (e.g., bottom side as shown in FIGS. 9-11) that is opposite the first side.

Thermal management unit of thermal management assembly 5005 includes one or more heat sinks each of which includes protrusions (e.g., fins and/or ribs) on multiple sides thereof. The one or more heat sinks of thermal management assembly 5005 may include, for example, heat sink 105. In the example shown in FIGS. 9-11, heat sink 105 is utilized. Heat sink 105 includes fins 11b on the first side (e.g., top side) of heat sink 105 and ribs 12d on the second side (e.g., bottom side) of heat sink 105. Heat sink 105 is similar to heat sink 103 in that fins 11b extend in a first direction and ribs 12d extend in a second direction that is different from, e.g., orthogonal, to the first direction. In the example shown in FIGS. 9-11, fins 11b and ribs 12d extend in orthogonal directions. In other embodiments, fins 11b and ribs 12b may extend in the same direction. Fins 11b may have straight or sloped side walls. Ribs 12d may have straight or sloped side walls. In the example shown in FIGS. 9-11, fins 11b and ribs 12d have straight side walls.

As shown in FIGS. 9-11, heat sink 105 is mounted on heat-generating device 82 and heat-generating device 82 is mounted on substrate 81. Heat-generating device 82 is bonded to and sandwiched between heat sink 105 and substrate 81. In some embodiments, heat-generating device 82 may be a ball-bumped IC chip that is soldered to substrate 81, which may be a PCB, and heat sink 105 may be bonded to heat-generating device 82, which is a ball-bumped IC chip. The bonding may utilize a thermal epoxy or metal solder. In the case of metal solder bonding, at least a portion of the second side (e.g., bottom side) of heat sink 105 is metalized.

Figure 12:
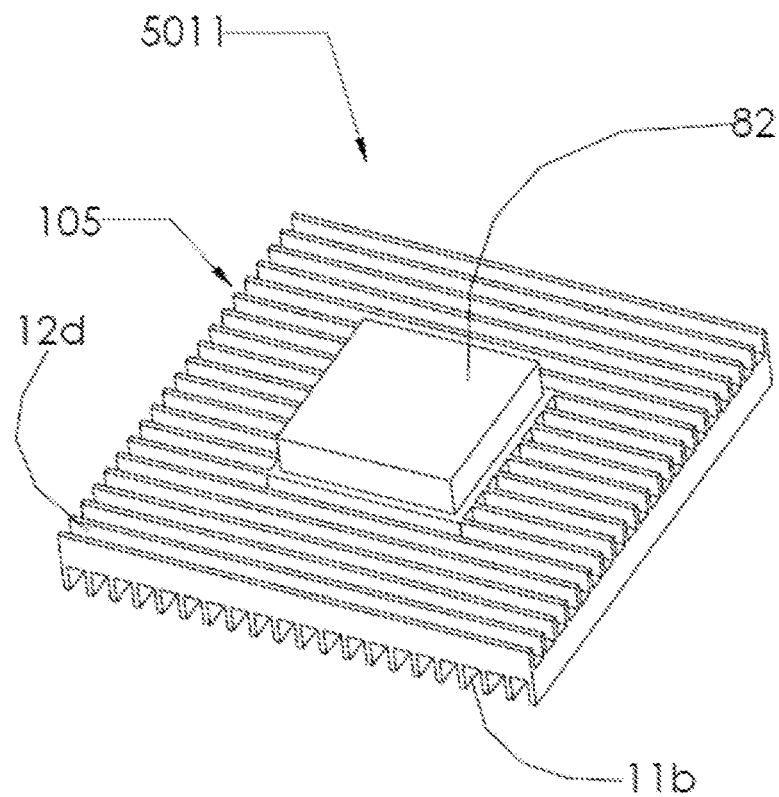
FIG. 12 is a perspective view of a thermal management assembly of a compact heat-generating device mounted on a heat sink in accordance with some embodiments of the present disclosure.
Figure 13:
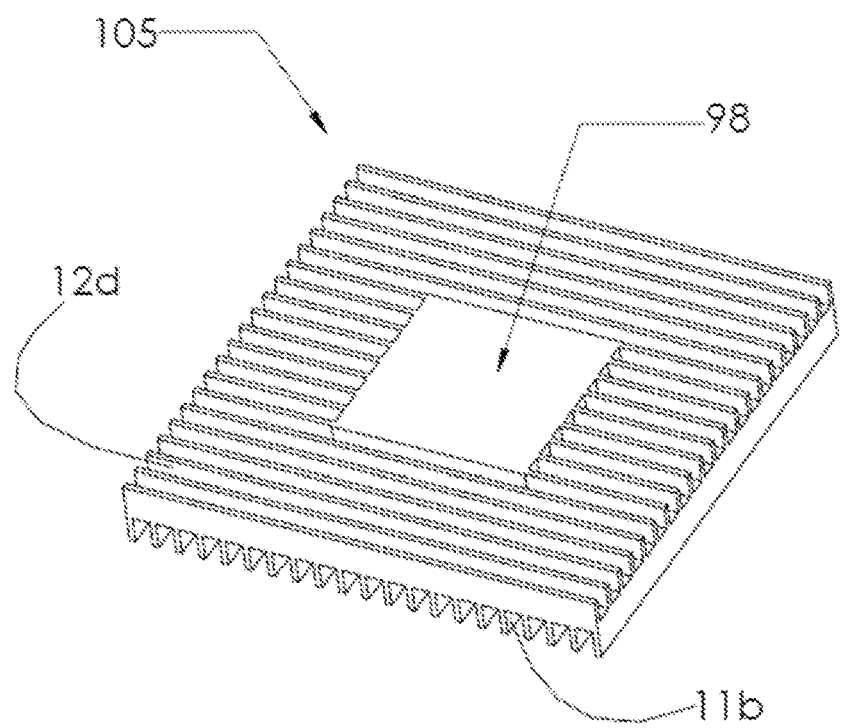
FIG. 13 is a perspective view of the heat sink of FIG. 12.

FIG. 12 is a perspective view of a thermal management assembly 5011 of heat-generating device 82 mounted on heat sink 105 in accordance with some embodiments of the present disclosure. FIG. 13 is a perspective view of heat sink 105.

As shown in FIGS. 12 and 13, heat-generating device 82 is mounted on the second side (e.g., bottom side) of heat sink 105. Other than ribs 12d, the second side of heat sink 105 also includes a mounting pad 98 that protrudes from the base portion of heat sink 105. Mounting pad 98 has a height that may be substantially the same as the height of ribs 12d. When heat-generating device 82 is disposed on the second side of heat sink 105, heat-generating device 82 may be disposed on mounting pad 98, as shown in FIG. 12. Mounting pad 98 may be constructed using chemical etch in a silicon micro-electro-mechanical systems (MEMS) process performed on single-crystal silicon.

Figure 14:
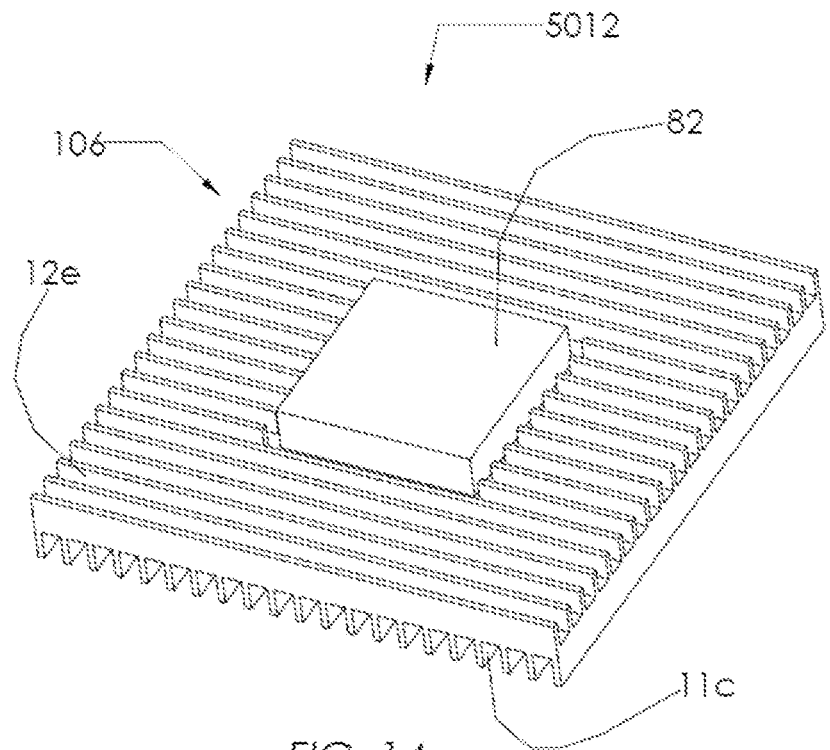
FIG. 14 is a perspective view of a thermal management assembly of a compact heat-generating device mounted on another heat sink in accordance with some embodiments of the present disclosure.
Figure 15:
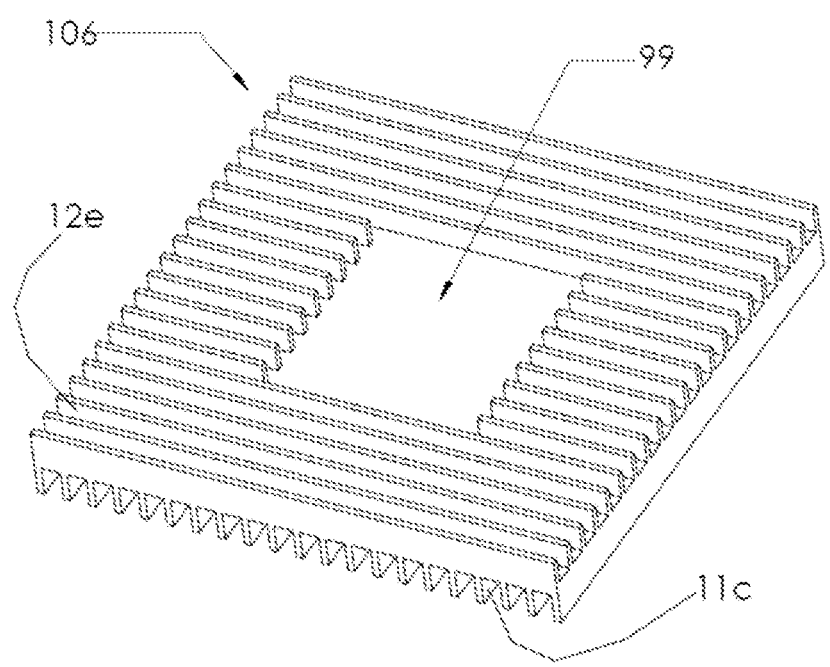
FIG. 15 is a perspective view of the heat sink of FIG. 14.

FIG. 14 is a perspective view of a thermal management assembly 5012 of heat-generating device 82 mounted on a heat sink 106 in accordance with some embodiments of the present disclosure. FIG. 15 is a perspective view of heat sink 106 of FIG. 14.

Heat sink 106 has fins 11c on the first side and ribs 12e on the second side thereof. Heat sink 106 is similar to heat sink 105 in that fins 11c extend in a first direction and ribs 12e extend in a second direction that is different from, e.g., orthogonal, to the first direction. In the example shown in FIGS. 14 and 15, fins 11c and ribs 12e extend in orthogonal directions. In other embodiments, fins 11c and ribs 12e may extend in the same direction. Fins 11c may have straight or sloped side walls. Ribs 12e may have straight or sloped side walls. In the example shown in FIGS. 14 and 15, fins 11c and ribs 12e have straight side walls.

Heat sink 106 differs from heat sink 105 in that, instead of a mounting pad 98 as in the case of heat sink 105, heat sink 106 includes a recess 99 on the second side thereof. Heat-generating device 82 is received in recess 99 when mounted on heat sink 106. Heat-generating device 82 may be bonded to recess 99 of heat sink 106 by solder or thermal epoxy. In the case of solder, at least a portion of the second side of heat sink 106 (e.g., recess 99) and the side of heat-generating device 82 that mates with recess 99 are metalized for soldering.

Figure 16A:
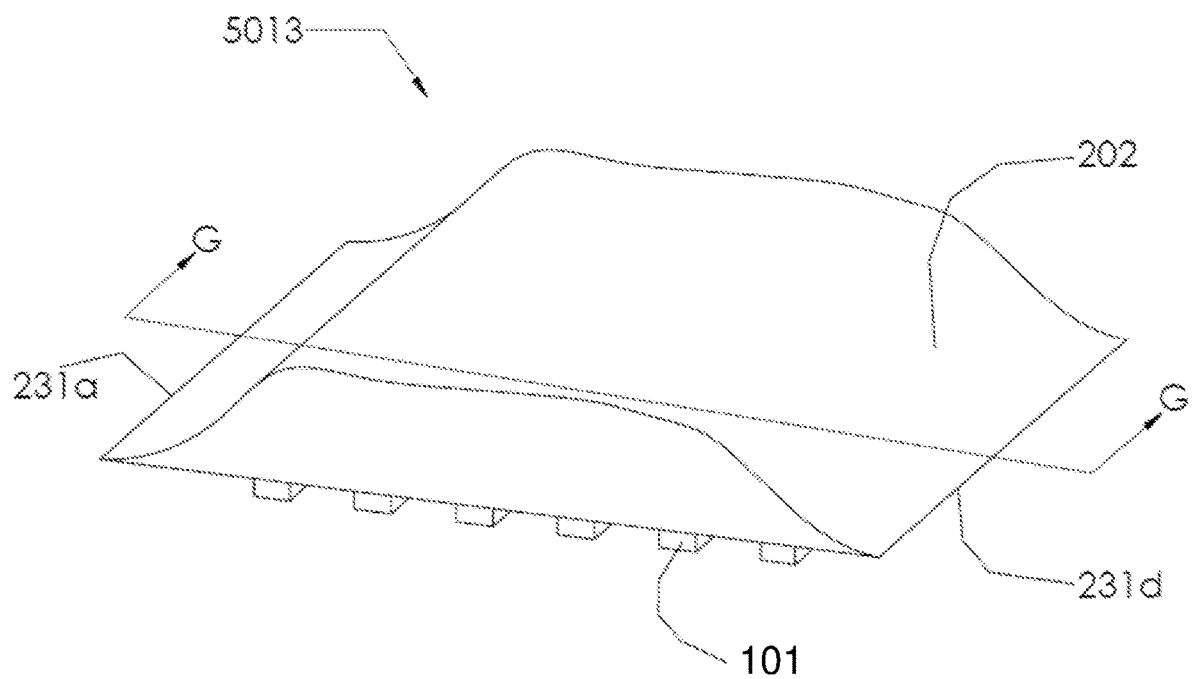
FIG. 16A is a perspective view of a thermal management assembly for an electronic apparatus and using a heat sink and a thermal reservoir in accordance with some embodiments of the present disclosure.
Figure 16B:
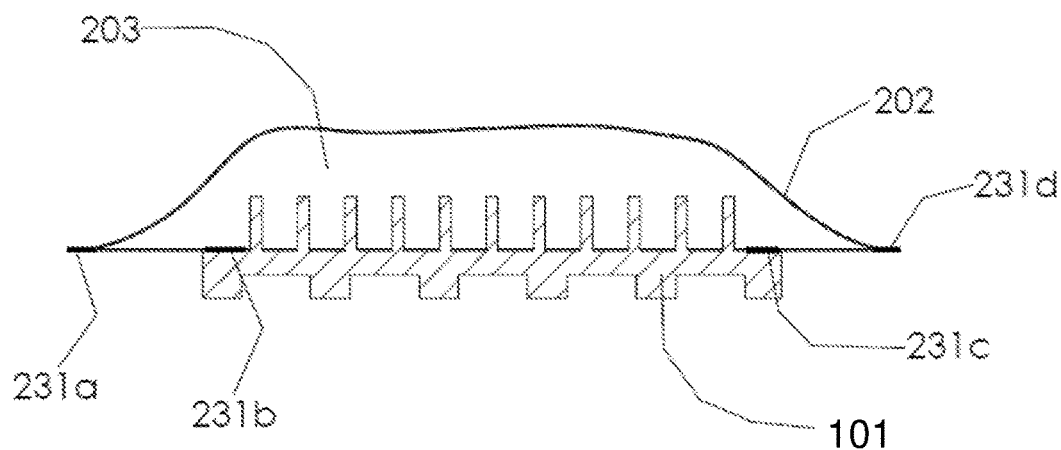
FIG. 16B is a cross-sectional view of the thermal management assembly of FIG. 16A.

FIG. 16A is a perspective view of a thermal management assembly 5013 for an electronic apparatus and using heat sink 101 and a thermal reservoir in accordance with some embodiments of the present disclosure. FIG. 16B is a cross-sectional view of thermal management assembly 5013 of FIG. 16A along line GG.

Although heat sink 101 is illustrated in FIGS. 16A and 16B, those skilled in the art would appreciate that the scope of the present disclosure is not limited thereto. For example, other heat sinks such as heat sink 102, heat sink 103, heat sink 104, heat sink 105 or heat sink 106 may be utilized in thermal management assembly 5013. For illustrative purposes heat sink 101 is shown in the example of FIGS. 16A and 16B.

Thermal reservoir includes a phase-change material 203 and a container 202. Phase-change material 203 is contained in a space defined by container 202 and heat sink 101. Phase-change material 203 may include a salt hydrate, an ionic liquid, paraffin, fatty acid, ester, an organic-organic compound, an organic-inorganic compound, or an inorganic-inorganic compound. Container 202 may be made of silicon, plastic, ceramic or metal. In the example shown in FIGS. 16A and 16B, container 202 is a pouch. The pouch may be coupled to heat sink 101 by heat and pressure, solder, pressure-sensitive adhesive, or epoxy. The pouch may be a metallic foil. In some embodiments, container 202 may be a pouch which may include an aluminum foil having surface areas coated with biaxially-oriented polyethylene terephthalate (BoPET). As shown in FIGS. 16A and 16B, container 202 is coupled to the first side of heat sink 101 such that fins 11 of heat sink 101 are in direct contact with phase-change material 203. Container 202, as a pouch, may be heat sealed (e.g., at heat seals 231a and 231d as shown in FIGS. 16A and 16B) with pressure or epoxy. Container 202, as a pouch, may also be heat sealed to heat sink 101 with heat seals 231b and 231c.

As container 202 is a pouch, it may expand after phase-change material 203 changes phase from a first phase to a second phase as a result of phase-change material 203 having absorb a certain amount of thermal energy therein. Likewise, container 202 may contract as phase-change material 203 change from the second phase back to the first phase as a result of the thermal energy being released from phase-change material 203.

Figure 17A:
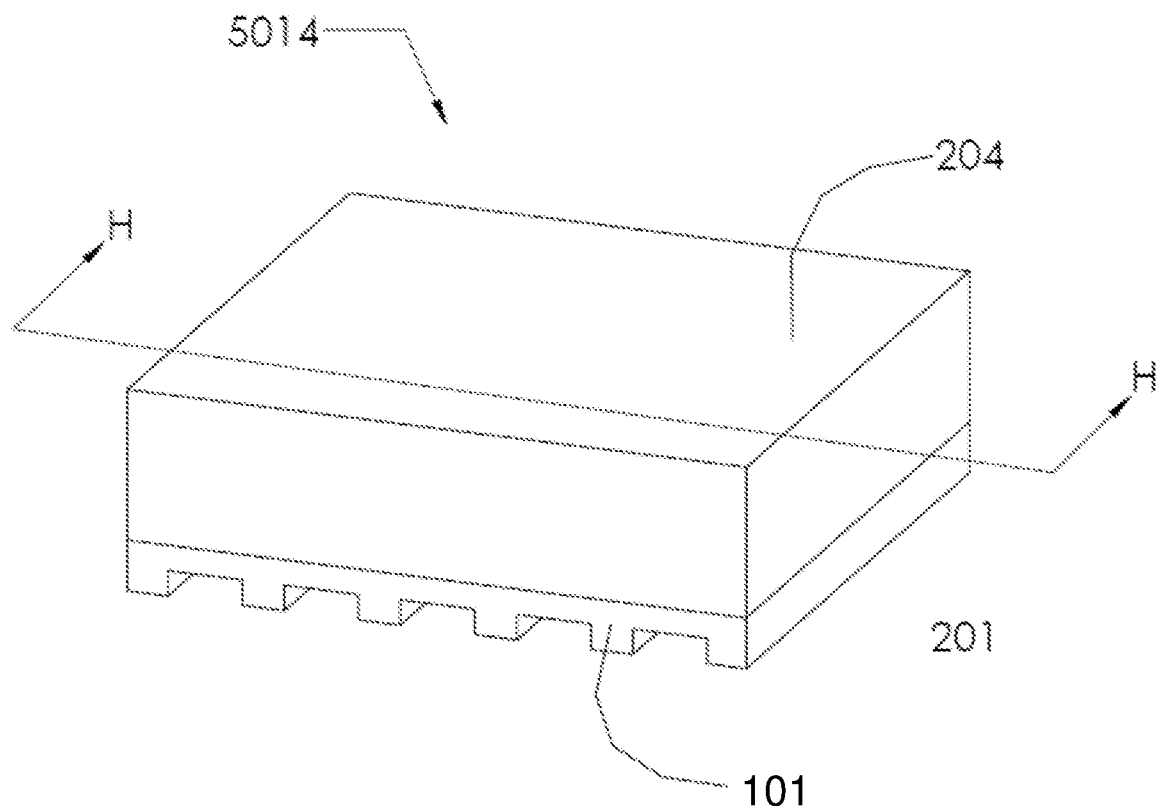
FIG. 17A is a perspective view of another thermal management assembly for an electronic apparatus and using a heat sink and a thermal reservoir in accordance with some embodiments of the present disclosure.
Figure 17B:
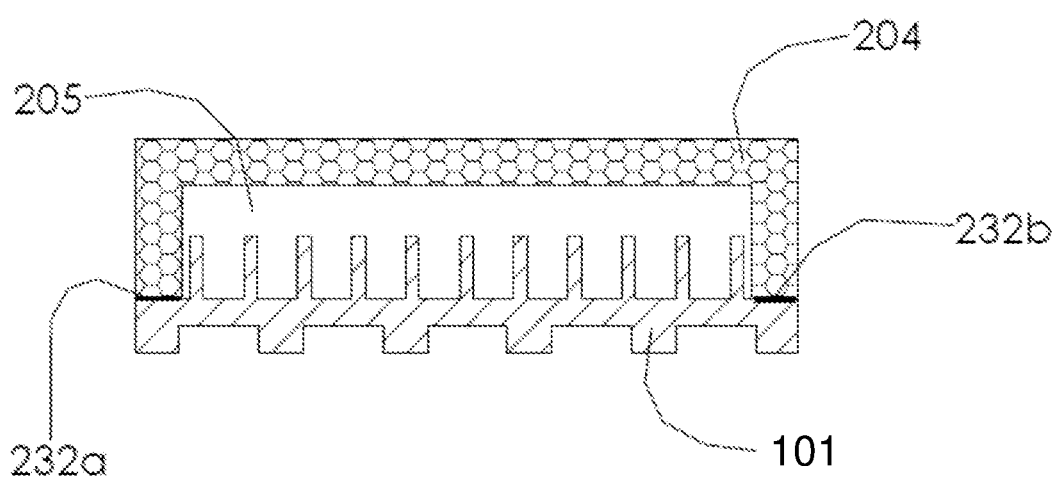
FIG. 17B is a cross-sectional view of the thermal management assembly of FIG. 17A.

FIG. 17A is a perspective view of a thermal management assembly 5014 for an electronic apparatus and using heat sink 101 and a thermal reservoir in accordance with some embodiments of the present disclosure. FIG. 17B is a cross-sectional view of thermal management assembly 5014 of FIG. 17A along line HH.

Although heat sink 101 is illustrated in FIGS. 17A and 17B, those skilled in the art would appreciate that the scope of the present disclosure is not limited thereto. For example, other heat sinks such as heat sink 102, heat sink 103, heat sink 104, heat sink 105 or heat sink 106 may be utilized in thermal management assembly 5014. For illustrative purposes heat sink 101 is shown in the example of FIGS. 17A and 17B.

Thermal reservoir includes a phase-change material 205 and a container 204. Phase-change material 205 is contained in a space defined by container 204 and heat sink 101. Phase-change material 205 may include a salt hydrate, an ionic liquid, paraffin, fatty acid, ester, an organic-organic compound, an organic-inorganic compound, or an inorganic-inorganic compound. Container 204 may be made of silicon, plastic, ceramic or metal. In the example shown in FIGS. 17A and 17B, container 204 is a silicon container made of silicon. The silicon container includes a hollow therein so that when the silicon container is coupled to heat sink 101 the hollow faces fins 11 of heat sink 101 to contain fins 11 therein. As shown in FIGS. 17A and 17B, container 204 is coupled to the first side of heat sink 101 such that fins 11 of heat sink 101 are in direct contact with phase-change material 205. Container 204 may be bonded to heat sink 101 at joints 232a and 232b with solder or epoxy.

Figure 18A:
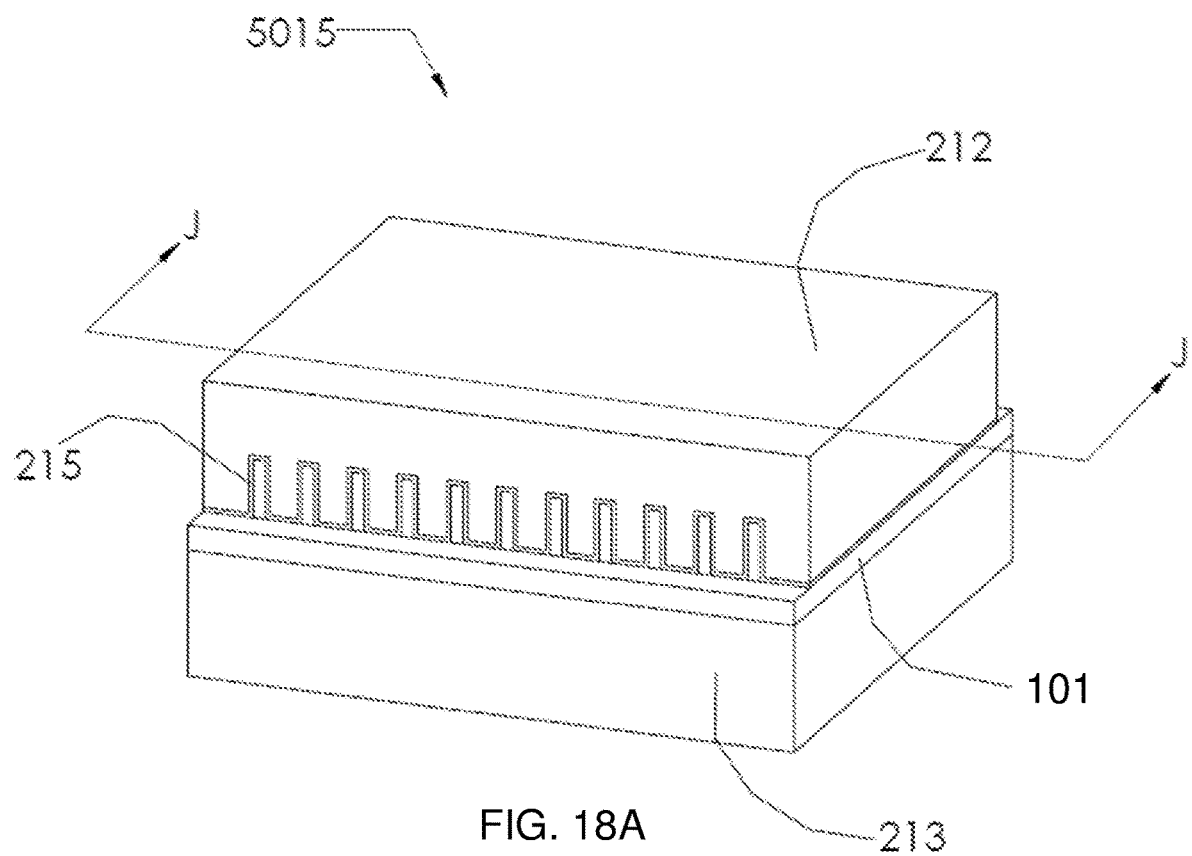
FIG. 18A is a perspective view of yet another thermal management assembly for an electronic apparatus and using a heat sink and a thermal reservoir in accordance with some embodiments of the present disclosure.
Figure 18B:
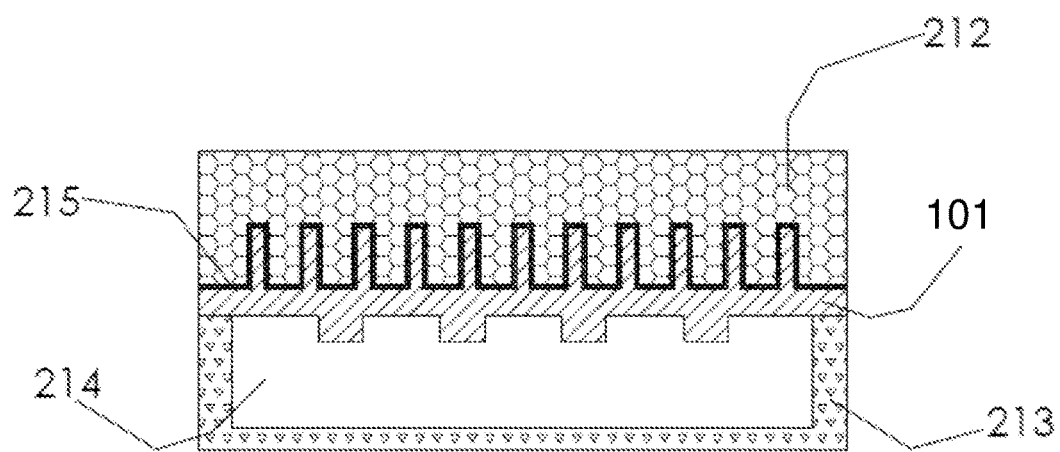
FIG. 18B is a cross-sectional view of the thermal management assembly of FIG. 18A.

FIG. 18A is a perspective view of yet another thermal management assembly 5015 for an electronic apparatus and using a heat sink 101 and a thermal reservoir in accordance with some embodiments of the present disclosure. FIG. 18B is a cross-sectional view of thermal management assembly 5015 of FIG. 18A along line JJ.

Although heat sink 101 is illustrated in FIGS. 18A and 18B, those skilled in the art would appreciate that the scope of the present disclosure is not limited thereto. For example, other heat sinks such as heat sink 102, heat sink 103, heat sink 104, heat sink 105 or heat sink 106 may be utilized in thermal management assembly 5015. For illustrative purposes heat sink 101 is shown in the example of FIGS. 18A and 18B.

Thermal reservoir includes a phase-change material 214 and a container 213. Phase-change material 214 is contained in a space defined by container 213 and heat sink 101. Phase-change material 214 may include a salt hydrate, an ionic liquid, paraffin, fatty acid, ester, an organic-organic compound, an organic-inorganic compound, or an inorganic-inorganic compound. Container 213 may be made of silicon, plastic, ceramic or metal. Container 213 includes a hollow therein so that when the container 213 is coupled to heat sink 101 the hollow faces fins 11 of heat sink 101 to contain fins 11 therein. As shown in FIGS. 18A and 18B, container 213 is coupled to the first side of heat sink 101 such that fins 11 of heat sink 101 are in direct contact with phase-change material 214. Alternatively, container 213 may be coupled to the second side of heat sink 101 such that ribs 12 of heat sink 101 are in direct contact with phase-change material 214.

Thermal management assembly 5015 also includes a heat-generating device 212. One side of heat-generating device 212 that faces heat sink 101 is patterned to receive, accommodate, fit or otherwise engage with heat sink 101. For example, as shown in FIGS. 18A and 18B, heat-generating device 212 may include a number of grooves to interlockingly receive or engage with fins 11 of heat sink 101. Alternatively, the grooves of heat-generating device 212 may be configured to interlockingly receive or engage with ribs 12 of heat sink 101. This feature maximizes the surface area for paths of heat transfer to conduct heat from heat-generating device 212 to heat sink 101. Medium 215 may be disposed between heat sink 101 and heat-generating device 212. Medium 215 may be, for example, thermal paste, thermal epoxy or solder.

Figure 19A:
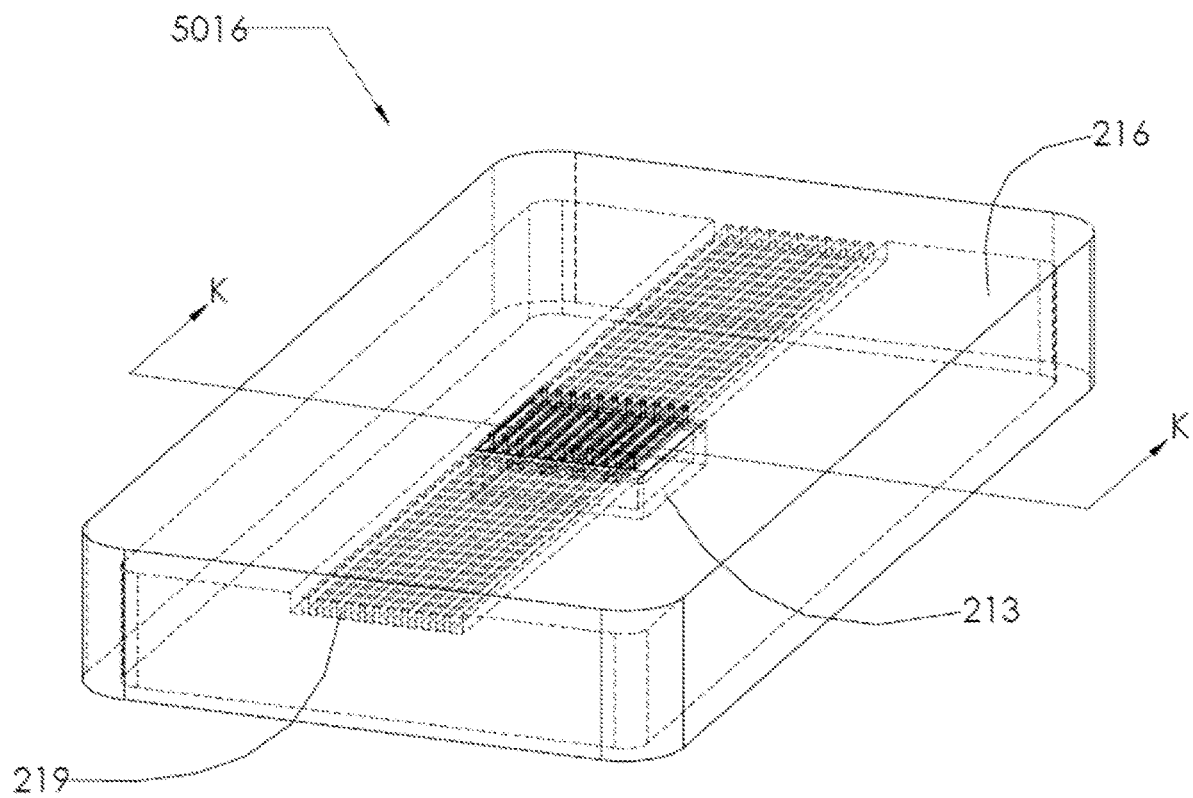
FIG. 19A is a perspective view of a part of an electronic apparatus utilizing a thermal management scheme in accordance with some embodiments of the present disclosure.
Figure 19B:
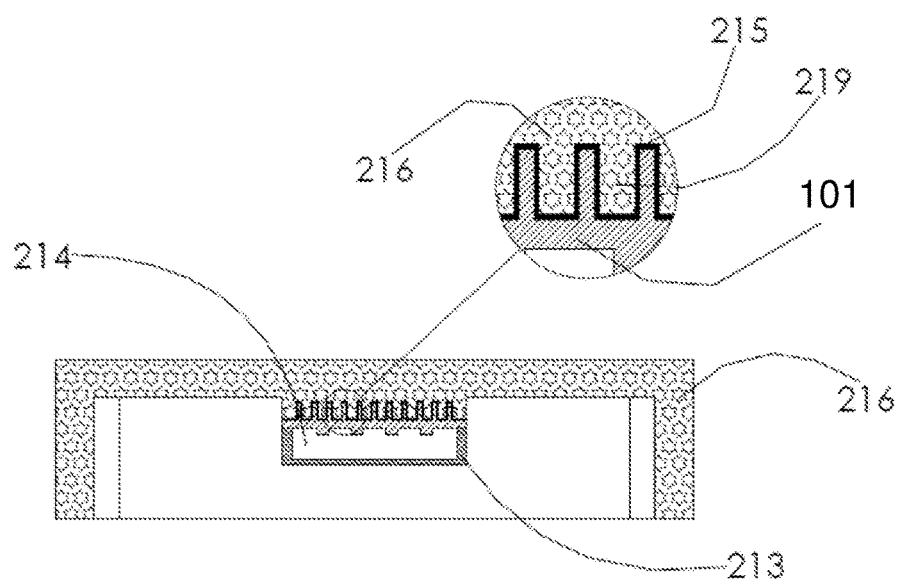
FIG. 19B is a cross-sectional view of the part of the electronic apparatus utilizing the thermal management scheme of FIG. 19A.

FIG. 19A is a perspective view of a part of an electronic apparatus 5016 utilizing a thermal management scheme in accordance with some embodiments of the present disclosure. FIG. 19B is a cross-sectional view of the part of the electronic apparatus 5016 of FIG. 19A along line KK.

Electronic apparatus 5016 includes a thermal management assembly. The thermal management assembly may be any of the ones described above or a variation thereof. For example, electronic apparatus 5016 may include thermal management assembly 5001, 5002, 5003, 5004, 5005, 5011, 5012, 5013, 5014 or 5015. The thermal management assembly of electronic apparatus 5016 include a thermal management unit which includes one or more heat sinks. Each of the one or more heat sinks of the thermal management assembly of electronic apparatus 5016 may be any of the previously described heat sinks such as, for example, heat sink 101, heat sink 102, heat sink 103, heat sink 104, heat sink 105 or heat sink 106. For illustrative purposes heat sink 101 is shown in the example of FIGS. 19A and 19B.

Electronic apparatus 5016 also includes an enclosure 216 that encloses the thermal management assembly therein. Enclosure 216 may be made of plastic or metal. The metal may be, for example, aluminum. As shown in FIGS. 19A and 19B, an inner side of enclosure 216 that faces the thermal management assembly is configured to interlockingly engage with protrusions (e.g., the first protrusion structure or the second protrusion structure) of the heat sink. This feature allows the first protrusion structure of the heat sink to interlock with enclosure 216. For example, the inner side of enclosure 216 that faces the thermal management assembly may include multiple grooves recessed into the inner side of enclosure 216 and corresponding to fins 11 of heat sink 101 of the thermal management assembly such that the grooves of enclosure 216 and fins 11 of heat sink 101 engage in an interlocking fashion. Alternatively, the inner side of enclosure 216 that faces the thermal management assembly may include multiple ribs 219 protruding from the inner side of enclosure 216 and corresponding to fins 11 of heat sink 101 of the thermal management assembly such that the ribs of enclosure 216 and fins 11 of heat sink 101 engage in an interlocking fashion. In the example shown in FIGS. 19A and 19B, ribs 219 on the inner side of enclosure 216 interlock with fins 11 of heat sink 101.

In some other embodiments (not shown), the inner side of enclosure 216 that faces the thermal management assembly may include multiple grooves recessed into the inner side of enclosure 216 and corresponding to ribs 12 of heat sink 101 of the thermal management assembly such that the grooves of enclosure 216 and ribs 12 of heat sink 101 engage in an interlocking fashion. Alternatively, the inner side of enclosure 216 that faces the thermal management assembly may include multiple ribs 219 protruding from the inner side of enclosure 216 and corresponding to ribs 12 of heat sink 101 of the thermal management assembly such that the ribs of enclosure 216 and ribs 12 of heat sink 101 engage in an interlocking fashion.

This feature maximizes the surface area for paths of heat transfer to conduct heat between enclosure 216 and heat sink 101. Medium 215 may be disposed between heat sink 101 and heat-generating device 212. Medium 215 may be, for example, thermal paste, thermal epoxy or solder.

When one or more heat-generating devices are thermally coupled to the heat sink, whether directly or indirectly, at least a portion of the heat transferred to the heat sink may be dissipated to enclosure 216 through protrusions (e.g., fins or ribs) of the heat sink that interlock with the grooves or ribs of enclosure 216. In this case, enclosure 216 functions as a thermal ground for the heat sink. The one or more heat-generating devices may be mounted with thermal epoxy (e.g., when the one or more heat-generating devices include a microprocessor or graphics chip), thermal epoxy (e.g., to aid the removal of heat from electronic apparatus 5016) or solder (e.g., when the one or more heat-generating devices include a LED or VCSEL).

Alternatively, as shown in FIGS. 19A and 19B, a thermal reservoir may be coupled to one side of the heat sink while the other side of the heat sink is coupled to enclosure 216. The thermal reservoir may include container 213. Container 213 may be made of silicon, plastic, ceramic or metal. Container 213 contains phase-change material 214 therein for protrusions (e.g., ribs 12 as shown in FIGS. 19A and 19B) of the heat sink (e.g., heat sink 101) to be in direct contact with phase-change material 214. In this case, heat in enclosure 216 may be transferred to phase-change material 214 of the thermal reservoir through the heat sink. Advantageously, when electronic apparatus 5016 is a portable device such as a smartphone, enclosure 216 would not be hot or even warm to touch as at least a portion of the thermal energy in enclosure 216 is transferred to the thermal reservoir through the heat sink. For example, during operation of electronic apparatus 5016, thermal energy inside enclosure 216 (e.g., transferred to enclosure 216 by one or more contacts between enclosure 216 and the one or more heat-generating devices of electronic apparatus 5016) may be transferred to and absorbed by phase-change material 214 due to temperature difference, i.e., thermal gradient, between enclosure 216 and thermal reservoir in which phase-change material 214 is contained. When electronic apparatus 5016 is not in operation or is in a sleep mode, standby mode or a type of low-power mode, thermal energy may be released from phase-change material 214 to enclosure 216 due to a reversal in temperature gradient (e.g., due to more thermal energy in thermal reservoir than in enclosure 216). This feature helps avoid temperature rise in enclosure 216 and thus improves the user experience.

Additional Notes and Conclusion

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A thermal management unit, comprising:
   a heat sink, comprising:
      a base portion having a first side and a second side opposite the first side;
      a first protrusion structure protruding from the first side of the base portion, the first protrusion structure comprising a plurality of fins, the plurality of fins having a same first height from a first edge of the base portion to a second edge of the base portion opposite the first edge; and
      a second protrusion structure protruding from the second side of the base portion, the second protrusion structure comprising a plurality of ribs, the plurality of ribs having a same second height from a third edge of the base portion to a fourth edge of the base portion opposite the third edge.

2. The thermal management unit of claim 1, wherein the fins extend along a first direction on the first side of the base portion, and wherein the ribs extend along a second direction on the second side of the base portion, the first direction and second direction orthogonal to one another.

3. The thermal management unit of claim 1, wherein each of the fins respectively includes a base connected to the base portion and a tip opposite the base thereof, wherein a surface facing an adjacent fin and connecting the tip and the base of a fin of the plurality of fins is greater than 90° with respect to a plane defined by the first side of the base portion.

4. The thermal management unit of claim 1, wherein each of the ribs respectively includes a base connected to the base portion and a tip opposite the base thereof, wherein a surface facing an adjacent rib and connecting the tip and the base of a rib of the plurality of ribs is greater than 90° with respect to a plane defined by the second side of the base portion.

5. The thermal management unit of claim 1, wherein the second protrusion structure further comprises a mounting pad.

6. The thermal management unit of claim 5, further comprising:
   a substrate; and
   a heat-generating device sandwiched between the mounting pad of the heat sink and the substrate.

7. The thermal management unit of claim 6, wherein the heat-generating device comprises a ball-bumped integrated-circuit (IC) chip, and wherein the substrate comprises a printed circuit board (PCB).

8. The thermal management unit of claim 6, wherein the heat-generating device is bonded to the substrate and the mounting pad of the heat sink.

9. The thermal management unit of claim 8, wherein the heat-generating device is bonded by a thermal epoxy or metal solder.

10. The thermal management unit of claim 1, wherein the heat sink further comprises a recess on the second side of the base portion.

11. The thermal management unit of claim 10, further comprising:
    a substrate; and
    a heat-generating device sandwiched between the recess of the heat sink and the substrate.

12. The thermal management unit of claim 10, wherein the heat-generating device comprises a ball-bumped integrated-circuit (IC) chip, and wherein the substrate comprises a printed circuit board (PCB).

13. The thermal management unit of claim 10, wherein the second protrusion structure further comprises a mounting pad, and wherein the heat-generating device is bonded to the substrate and the mounting pad of the heat sink.

14. The thermal management unit of claim 13, wherein the heat-generating device is bonded by a thermal epoxy or metal solder.

* * * * *